(12) United States Patent
Kumazaki

(10) Patent No.: US 8,310,878 B2
(45) Date of Patent: Nov. 13, 2012

(54) SEMICONDUCTOR STORAGE DEVICE AND BOOSTING CIRCUIT

(75) Inventor: Noriyasu Kumazaki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 165 days.

(21) Appl. No.: 12/956,423

(22) Filed: Nov. 30, 2010

(65) Prior Publication Data

US 2011/0128792 A1 Jun. 2, 2011

(30) Foreign Application Priority Data

Dec. 1, 2009 (JP) ................................. 2009-273817

(51) Int. Cl.
*G11C 11/34* (2006.01)
(52) U.S. Cl. .................................. 365/185.23; 365/226
(58) Field of Classification Search ............. 365/185.23, 365/226
See application file for complete search history.

(56) References Cited

U.S. PATENT DOCUMENTS 6,865,118 B2 * 3/2005 Kwon ...................... 365/189.09

FOREIGN PATENT DOCUMENTS

JP 2004-348806 12/2004

* cited by examiner

*Primary Examiner* — Son Dinh
*Assistant Examiner* — Nam Nguyen
(74) *Attorney, Agent, or Firm* — Oblon, Spivak, McClelland, Maier & Neustadt, L.L.P.

(57) ABSTRACT

A boosting circuit includes first to fourth rectification elements, first to fourth MOS transistors, first to fourth capacitors, and a switch circuit. The switch circuit has a low level terminal connected to a first connection node between the first end of the third rectification element and the first end of the fourth rectification element, and a high level terminal connected to a second connection node between a second end of the third MOS transistor and a second end of the fourth MOS transistor. The switch circuit conducts changeover between a voltage at the low level terminal and a voltage at the high level terminal to output a resultant voltage to the output terminal.

20 Claims, 23 Drawing Sheets

SEMICONDUCTOR STORAGE DEVICE AND BOOSTING CIRCUIT

CROSS-REFERENCE TO RELATED APPLICATION

This application is based upon and claims the benefit of priority from the prior Japanese Patent Application No. 2009-273817, filed on Dec. 1, 2009, the entire contents of which are incorporated herein by reference.

FIELD

The present invention relates to, for example, a semiconductor storage device such as a NAND flash memory having a boosting circuit.

BACKGROUND

As mobile devices such as portable telephones are spread in recent years, memories used in these mobile devices are required to have lower current dissipation.

NAND flash memories are widely used in these mobile devices. It is extremely important to reduce the operation current of the NAND flash memories.

On the other hand, in "read", "write (program)" and "erase" which are basic operations of the NAND flash memories, various boosted voltages (voltages generated in the memory which are higher than the power supply voltage supplied to the memory) generated by a boosting circuit are used.

For securing the reliability, therefore, a plurality of boosting circuits which supply various voltages are needed. As a result, the current consumption of the NAND flash memory is increased.

In some conventional boosting circuits, the number of boosting stages is changed over by a switch and boosted voltages of two kinds are output (see, for example, JP-A-2004-348806 (KOKAI)).

However, specific description concerning a clock signal which causes a pump in each boosting stage in the conventional boosting circuit to operate is not found, and study about the pump efficiency, i.e., the current dissipation is not conducted.

DETAILED DESCRIPTION

Figure 1:
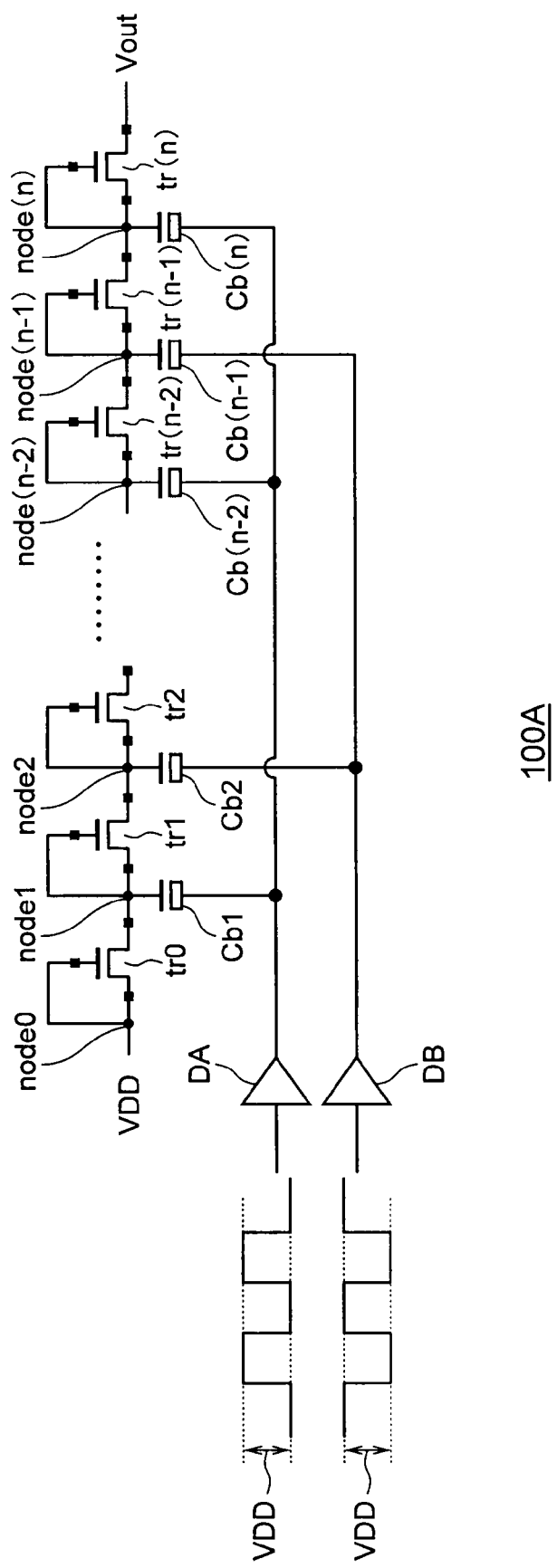
FIG. 1 is a circuit diagram showing a typical Dickson type boosting circuit 100A.

A boosting circuit according to the present embodiment boosts a power supply voltage and outputs a resultant boosted voltage from an output terminal. The boosting circuit includes a first clock terminal supplied with a first clock signal; a second clock terminal supplied with a second clock signal, the second clock signal having a phase inverted with respect to a phase of the first clock signal and having same amplitude and period as those of the first clock signal; a third clock terminal supplied with a third clock signal; and a fourth clock terminal supplied with a fourth clock signal, the fourth clock signal having a phase inverted with respect to a phase of the third clock signal and having same amplitude and period as those of the third clock signal. The boosting circuit includes a first rectification element connected at a first end thereof to a first power supply terminal, the power supply voltage being applied to the first power supply terminal; a first MOS transistor which is connected at a first end thereof to a second end of the first rectification element and is diode-connected; and a first capacitor connected between a gate of the first MOS transistor and the first clock terminal. The boosting circuit includes a second rectification element connected at a first end thereof to a second power supply terminal, the power supply voltage being applied to the second power supply terminal; a second MOS transistor which is connected at a first end thereof to a second end of the second rectification element and is diode-connected; a second capacitor connected between a gate of the second MOS transistor and the second clock terminal. The boosting circuit includes a third rectification element connected at a first end thereof to a second end of the first MOS transistor; a third MOS transistor which is connected at a first end thereof to a second end of the third rectification element and is diode-connected; and a third capacitor connected between a gate of the third MOS transistor and the third clock terminal. The boosting circuit includes a forth rectification element connected at a first end thereof to a second end of the second MOS transistor; a fourth MOS transistor which is connected at a first end thereof to a second end of the fourth rectification element and is diode-connected; and a fourth capacitor connected between a gate of the fourth MOS transistor and the fourth clock terminal. The boosting circuit includes a switch circuit which has a low level terminal connected to a first connection node between the first end of the third rectification element and the first end of the fourth rectification element, and a high level terminal connected to a second connection node between a second end of the third MOS transistor and a second end of the fourth MOS transistor, the switch circuit conducting changeover between a voltage at the low level terminal and a voltage at the high level terminal to output a resultant voltage to the output terminal.

Embodiments will now be explained with reference to the accompanying drawings.

Comparative Example

As a comparative example, boosting operation of a Dickson type boosting circuit, and a cell configuration and a basic operation of a NAND flash memory cell will now be described to elucidate problems in the conventional technique.

FIG. 1 is a circuit diagram showing a typical Dickson type boosting circuit 100A.

The boosting circuit 100A shown in FIG. 1 includes drivers DA and DB, capacitors Cb1 to Cb(n), and nMOS transistors tr0 to tr(n).

Supposing that the MOS transistor tr0 has a threshold voltage Vf, power supply voltage VDD—the threshold voltage Vf is transferred to a terminal node 1.

In this state, for example, the driver DA is clocked to a "high" level (the power supply voltage VDD), and the driver DB is clocked to a "low" level (0V) because it operates in the opposite phase. This operation is called "boot". At this time, a voltage V1 at the terminal node 1 is represented by Expression (1).

$$V1 = VDD - Vf + V' \tag{1}$$

In Expression (1), a voltage V' is a potential raised by coupoling through the capacitor Cb1 (capacitance of the capacitor Cb1 to the capacitor Cb(n) is represented by Cboot) when the driver DA boots. This voltage V' is found by Expression (2).

$$V' = \{Cboot/(Cboot + Cpara)\} * VDD \tag{2}$$

In Expression (2), Cpara represents parasitic capacitance of each of terminals node 1 to node (n). A ratio represented by Cboot/(Cboot+Cpara) is referred to as boot ratio.

In addition, a voltage V2 at the terminal node 2 is represented by Expression (3). In other words, if the nMOS transistor tr1 has the threshold voltage Vf, the voltage V2 has a value obtained by lowering the voltage V1 represented by Expression (1) by the threshold voltage.

$$V2 = VDD - Vf + V' - Vf \tag{3}$$

Then, the output of the driver DA changes to the "low" level (0V) (whereas the output of the driver DB changes to the "high" level (the power supply voltage VDD)). At this time, a potential V2' at the terminal node 2 is represented by Expression (4) because of coupling with the capacitance Cb1.

$$V2' = VDD + 2(V' - Vf) \tag{4}$$

An output voltage Vout of the boosting circuit 100A having n output stages shown in FIG. 1 can be represented by Expression (5). In other words, for making the output voltage Vout a high voltage, it is necessary to make the number n of output stages large.

$$Vout = VDD + n(V' - Vf) - Vf \tag{5}$$

For efficiently boosting a high voltage, it is considered from Expression (5) to be necessary to make the boot ratio close to unity.

Figure 2:
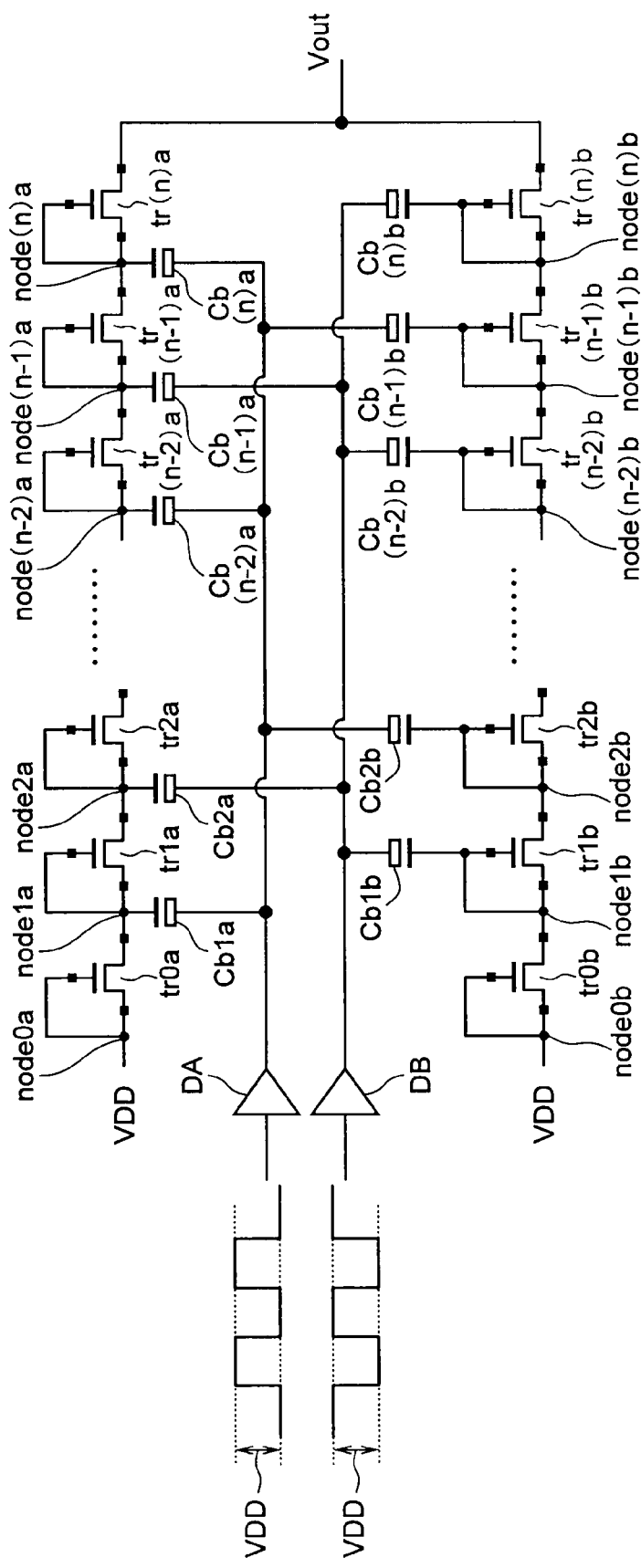
FIG. 2 is a circuit diagram showing an example of a two-phase type boosting circuit 200A.

FIG. 2 is a circuit diagram showing an example of a two-phase type boosting circuit 200A.

In the boosting circuit 100A already described with reference to FIG. 1, boosting operation (boot) is conducted once during one period of the clock.

On the other hand, as shown in FIG. 2, the boosting circuit 200A includes drivers DA and DB, capacitors for booting Cb1a to Cb(n)a and Cb1b to Cb(n)b, and nMOS transistors tr0a to tr(n)a and tr0b to tr(n)b. The boosting circuit 200A conducts the boosting operation twice during one period of the clock and conducts boosting with high efficiency.

A cell array configuration of the NAND flash memory will now be described.

Figure 3:
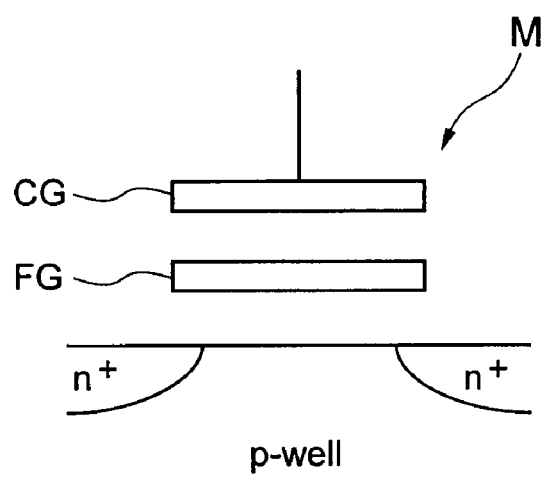
FIG. 3 is a diagram showing an example of a configuration of a memory cell transistor M of the NAND flash memory.

FIG. 3 is a diagram showing an example of a configuration of a memory cell transistor M of the NAND flash memory.

As shown in FIG. 3, one cell of the NAND flash memory is formed of a memory cell transistor M including a floating gate electrode FG and a control gate CG formed over a substrate (well) p-well.

Figure 4:
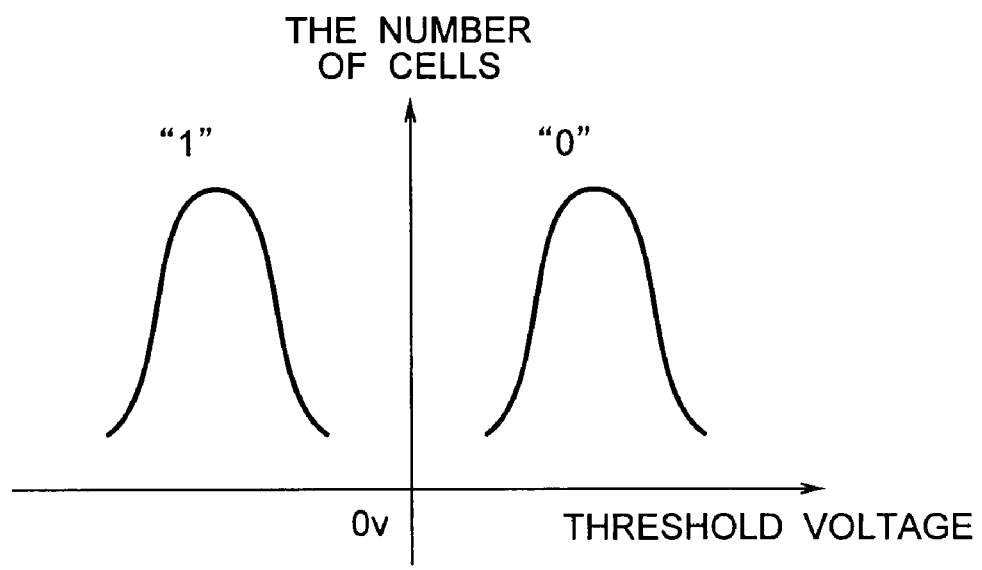
FIG. 4 is a diagram showing an example of a relation between distribution of threshold voltage of the memory cell transistor M and stored data.

FIG. 4 is a diagram showing an example of a relation between distribution of threshold voltage of the memory cell transistor M and stored data.

As shown in FIG. 4, the threshold voltage of the memory cell transistor M is divided into two distributions by "injecting/discharging" electrons "into/from" the floating gate electrode FG which is electrically insulated from the memory cell transistor M. In other words, data can be stored in the memory cell transistor M by assigning data "0" and data "1" to the respective distributions.

Figure 5:
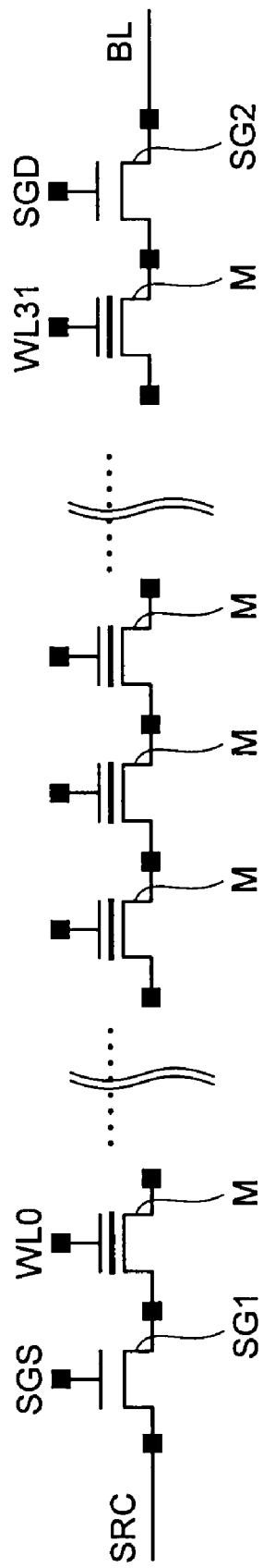
FIG. 5 is a diagram showing an example of a configuration of a NAND string in the NAND flash memory.

FIG. 5 is a diagram showing an example of a configuration of a NAND string in the NAND flash memory.

As shown in FIG. 5, word lines WL0 to WL31 are connected to control gate electrodes CG of memory cell transistors M, respectively. The NAND string is formed by connecting the memory cell transistors M in series. A selection gate transistor SG1 is connected to a memory cell transistor M disposed at an end on a source line SRC side. A selection gate transistor SG2 is connected to a memory cell transistor M disposed at an end on a bit line BL side.

Figure 6:
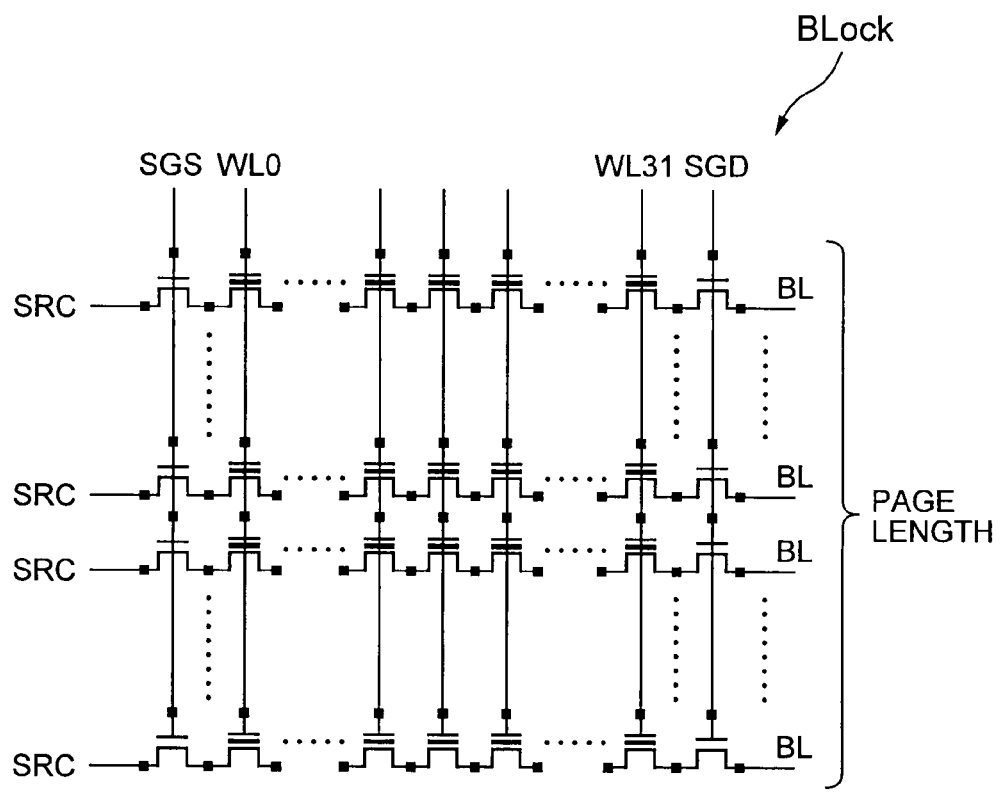
FIG. 6 is a diagram showing an example of a configuration of one block in a memory cell array of the NAND flash memory.
Figure 7:
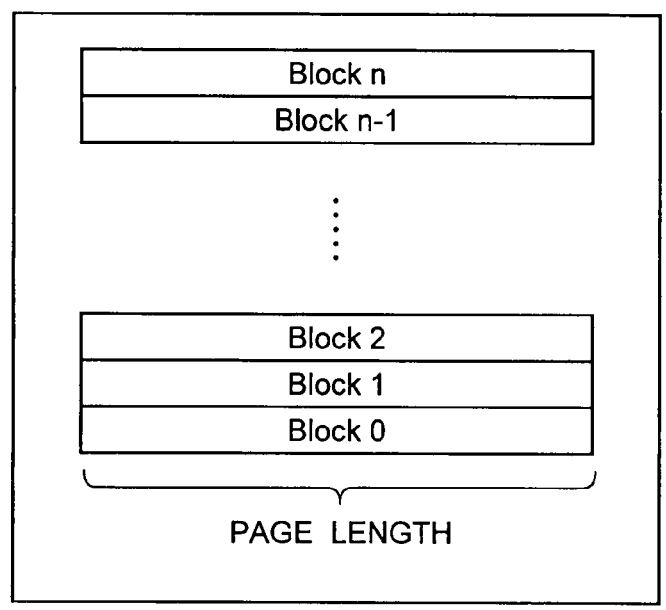
FIG. 7 is a diagram showing an example of a configuration of one plane in the NAND flash memory.

FIG. 6 is a diagram showing an example of a configuration of one block in a memory cell array of the NAND flash memory. FIG. 7 is a diagram showing an example of a configuration of one plane in the NAND flash memory.

As shown in FIG. 6, a block is formed by disposing a plurality of NAND strings each having selection gate transistors SG1 and SG2 respectively connected at gates to selection lines SGS and SGD on respective sides, by a page length.

And as shown in FIG. 7, a set of a plurality of blocks block 0 to block n forms one plane.

A basic operation of the NAND flash memory will now be described.

First, a read operation of the NAND flash memory will be described.

Figure 8:
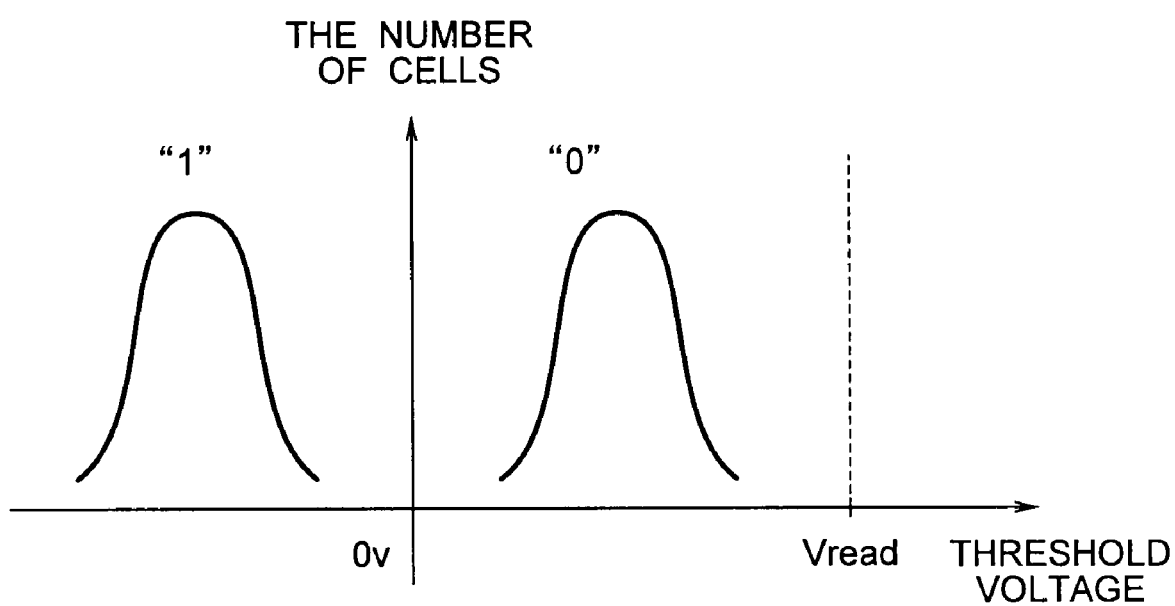
FIG. 8 is a diagram showing relations between distributions of the threshold voltage of a memory cell transistor and its voltage Vread.

FIG. 8 is a diagram showing relations between distributions of the threshold voltage of a memory cell transistor and its voltage Vread.

The memory cell transistor has two threshold distributions, as shown in FIG. 8, according to charge on the floating gate electrode FG. In other words, definition can be made to store 1-bit data in one cell by assigning data "0" and data "1" to the two distributions, respectively.

For example, data "0" is assigned to the threshold voltage distribution corresponding to a state in which electrons are injected into the floating gate electrode FG. On the other hand, data "1" is assigned to the threshold voltage distribution corresponding to a state in which electrons are emitted from the floating gate electrode FG.

As shown in FIG. 8, the voltage Vread is a potential which is higher than the highest threshold distribution corresponding to the data "0". Furthermore, 0 V is located midway between the two threshold distributions.

Figure 9:
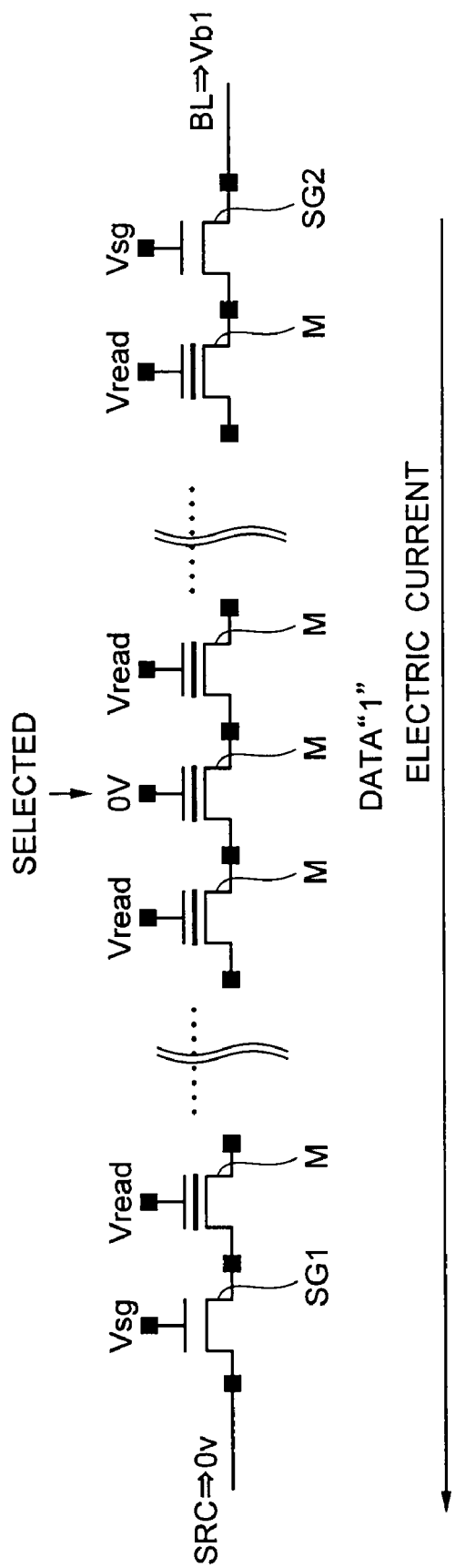
FIG. 9 is a diagram for explaining an example of NAND string read operation in the case where the selected memory cell transistor has data "1" stored therein.
Figure 10:
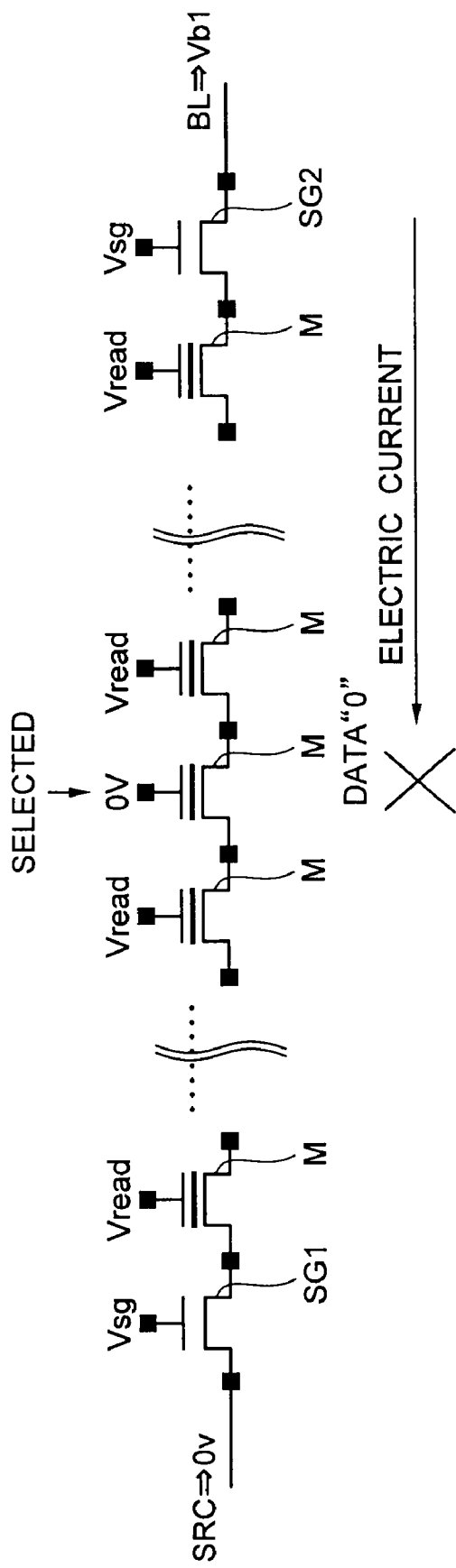
FIG. 10 is a diagram for explaining an example of NAND string read operation in the case where the selected memory cell transistor has data "0" stored therein.

FIG. 9 is a diagram for explaining an example of NAND string read operation in the case where the selected memory cell transistor has data "1" stored therein. FIG. 10 is a diagram for explaining an example of NAND string read operation in the case where the selected memory cell transistor has data "0" stored therein.

For example, as shown in FIG. 9, a voltage on a word line WL of the selected memory cell transistor from which data is to be read is set equal to 0 V, whereas a voltage on word lines WL of other unselected memory cell transistors M is set equal to the voltage Vread. Furthermore, a voltage Vb1 is applied to the bit line BL. In addition, a voltage Vsg is applied to gates of the selection gate transistors SG1 and SG2 to turn on the selection gate transistors SG1 and SG2.

By the way, the voltage Vsg is a voltage required for the NAND string to transfer the voltage Vb1 applied to the bit line BL.

If the threshold of the selected memory cell transistor M is 0 V or less (data "1"), then 0 V is applied to the control gate electrode (the word line WL) of the selected memory cell transistor M, and consequently the selected memory cell transistor M is brought into the conduction state. In addition, the voltage Vread is applied to word lines WL of other unselected memory cell transistors M.

Therefore, no matter whether data stored in an unselected memory cell transistor M is data "0" or "1", the unselected memory cell transistor M is brought into the conduction state. As a result, a current flows through the NAND string.

On the other hand, as shown in FIG. 10, if the threshold voltage of the selected memory cell transistor M is at least 0 V (data "0"), the selected memory cell transistor M is not brought into the conduction state even when 0 V is applied to the control gate electrode (word line WL) of the selected memory cell transistor M.

As a result, a current does not flow through the NAND string.

Accordingly, data "0" or data "1" stored in the selected memory cell transistor M can be read by determining whether a current "flows" or "does not flow" through the NAND string.

The write (program) operation of the NAND flash memory will now be described.

Figure 11:
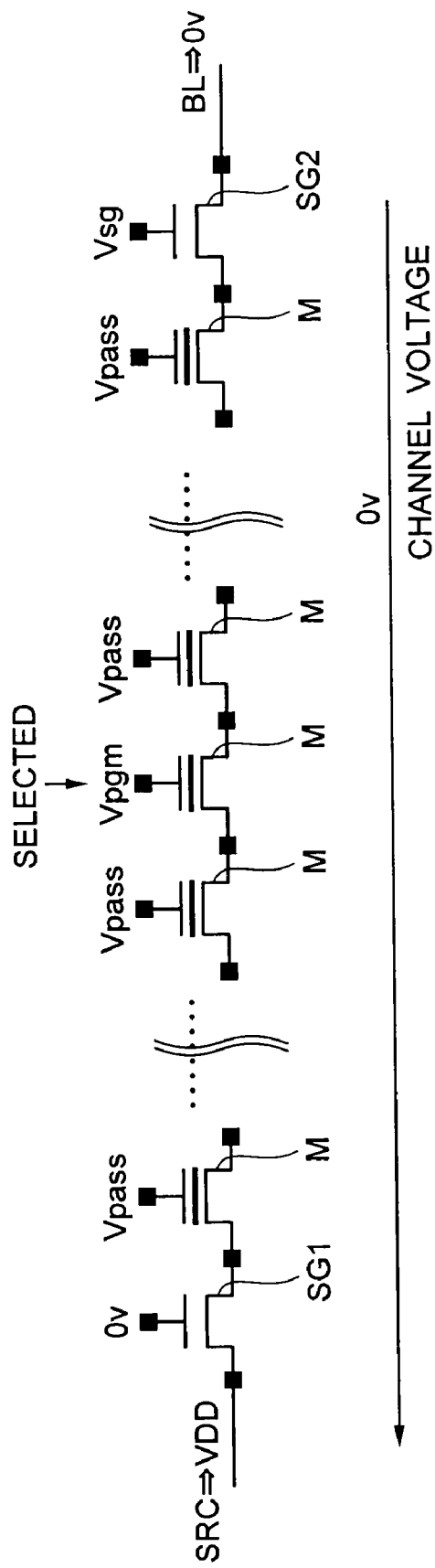
FIG. 11 is a diagram for explaining an example of the write operation of the NAND string in the case where data "0" is to be stored in the selected memory cell transistor.
Figure 12:
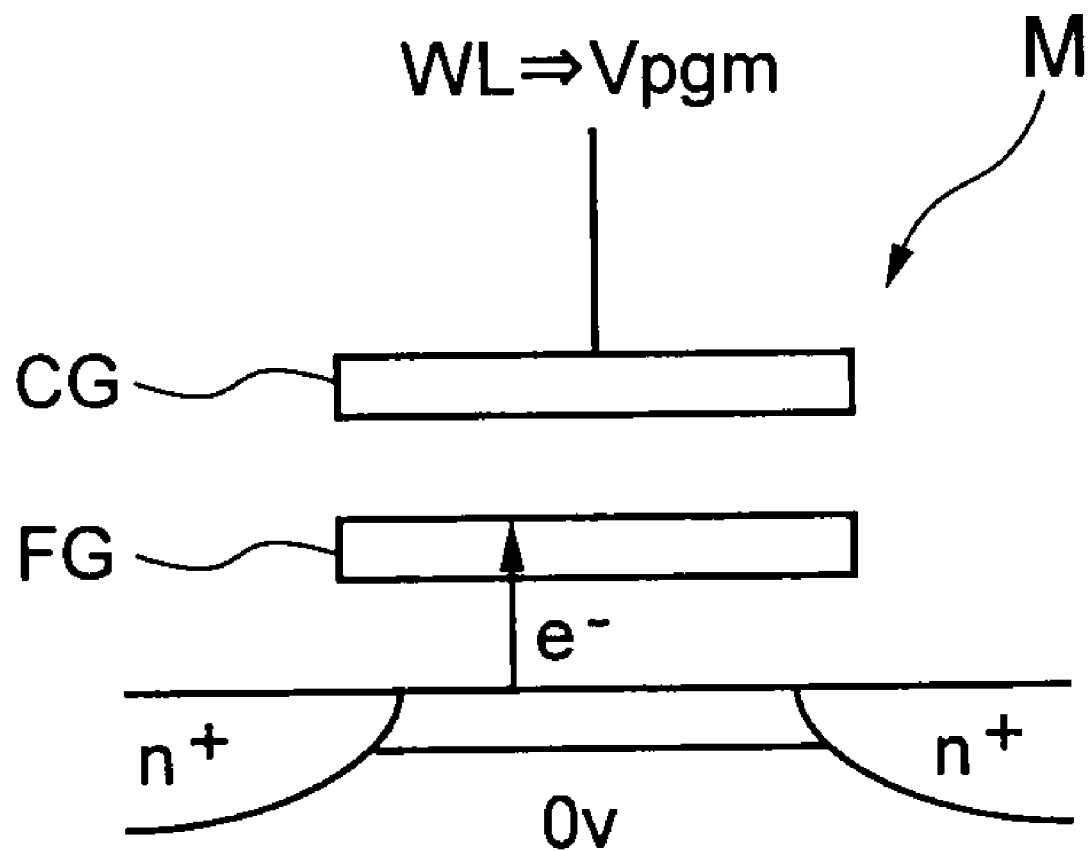
FIG. 12 is a diagram showing relations of potential in the case where data "0" is to be stored in the selected memory cell transistor.
Figure 13:
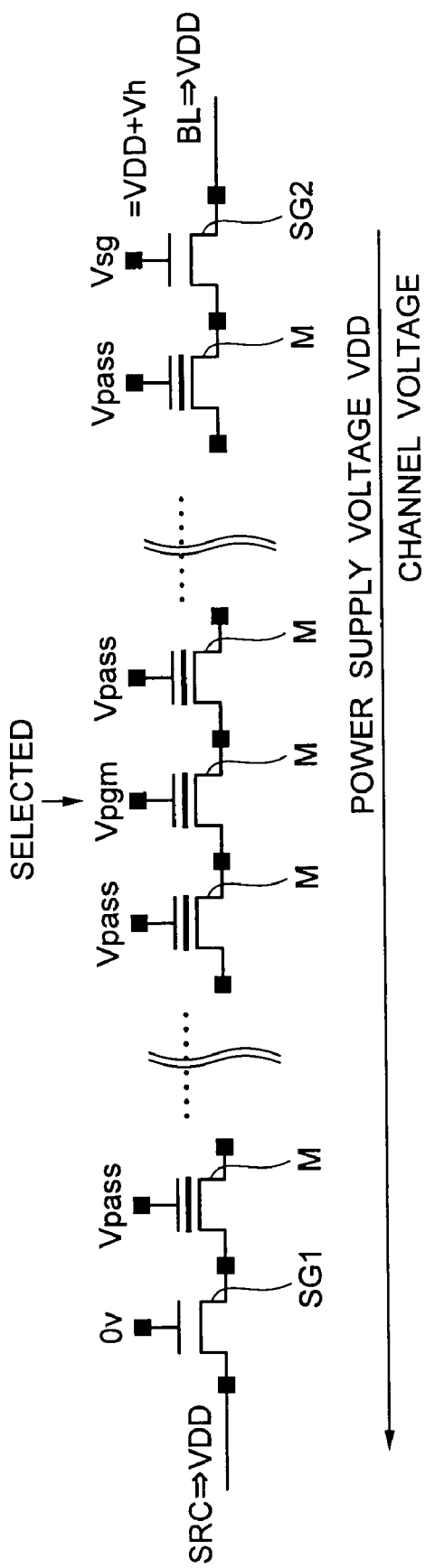
FIG. 13 is a diagram for explaining an example of the write operation of the NAND string in the case where data "1" is to be stored in the selected memory cell transistor.
Figure 14:
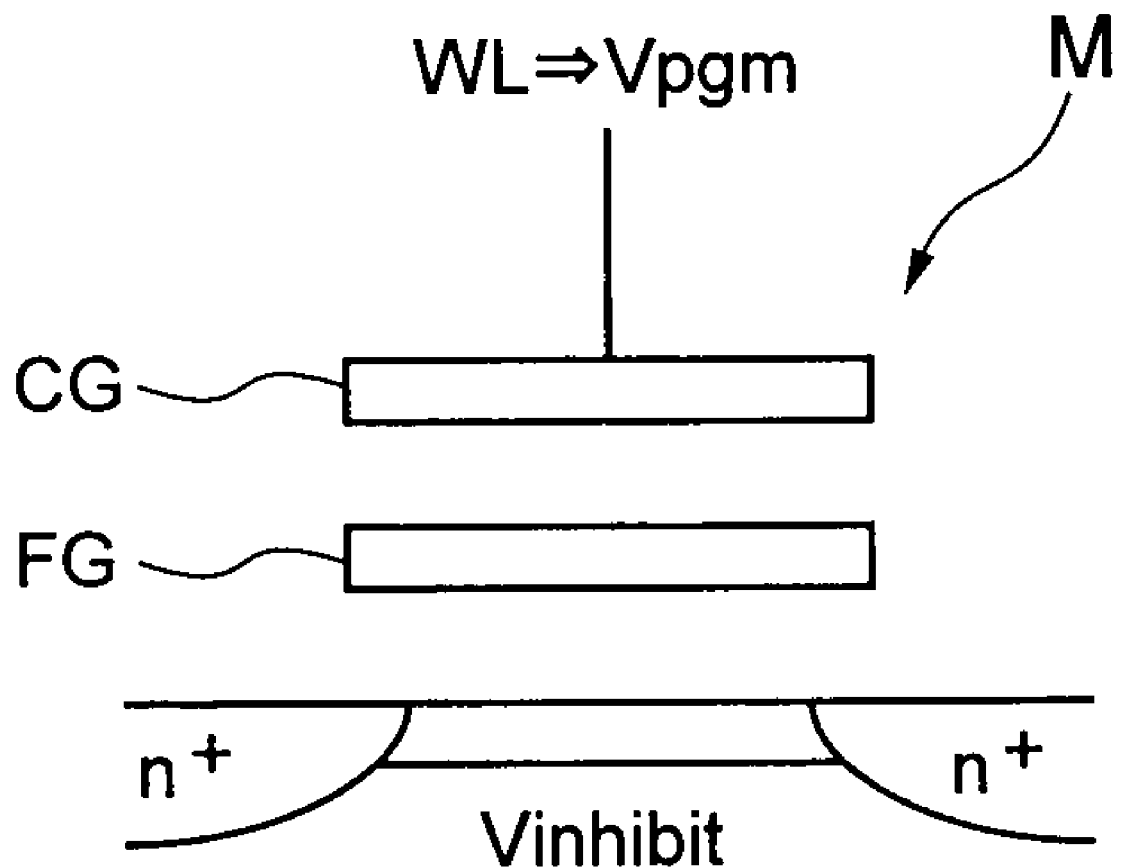
FIG. 14 is a diagram showing relations of potential in the case where data "1" is to be stored in the selected memory cell transistor.

FIG. 11 is a diagram for explaining an example of the write operation of the NAND string in the case where data "0" is to be stored in the selected memory cell transistor. FIG. 12 is a diagram showing relations of potential in the case where data "0" is to be stored in the selected memory cell transistor. FIG. 13 is a diagram for explaining an example of the write operation of the NAND string in the case where data "1" is to be stored in the selected memory cell transistor. FIG. 14 is a diagram showing relations of potential in the case where data "1" is to be stored in the selected memory cell transistor.

When writing data "0" into the selected memory cell transistor M, the gate voltage of the selection gate transistor SG2 is set equal to the voltage Vsg and the gate voltage of the selection gate transistor SG1 is set equal to 0 V, as shown in FIG. 11. In addition, 0 V is applied to the bit line BL.

In this state, the voltage Vpass is applied to control gate electrodes (word lines) of unselected memory cell transistors M whereas a voltage Vpgm is applied to the control gate electrode (word line) of the selected memory cell transistor M.

Consequently, a potential difference between the voltage (=0V) on the channel of the NAND string and the gate voltage of the selected memory cell transistor M becomes large. As a result, electrons (e⁻) are injected into the floating gate electrode FG (FIG. 12). The injection of the electrons is conducted by an FN tunnel current.

In this way, the threshold voltage of the selected memory cell transistor M is located in the threshold distribution where data "0" has been assigned, as shown in FIG. 8, by injecting electrons into the floating gate electrode FG.

Then, when writing data "1" into the selected memory cell transistor M, the gate voltage of the selection gate transistor SG2 is set equal to the voltage Vsg and the gate voltage of the selection gate transistor SG1 is set equal to 0 V as shown in FIG. 13. In addition, the power supply voltage VDD is applied to the bit line BL.

The voltage Vsg is a voltage which makes it possible for the selection gate transistor SG2 to transfer the power supply voltage VDD. Here, the voltage Vsg=power supply voltage VDD+voltage Vth. The voltage Vth is a threshold voltage of the selection gate transistor SG2.

In this way, a voltage between the gate and source of the selection gate transistor SG2 on the bit line BL side becomes equal to the threshold voltage Vth. As a result, the channel of the NAND string is in a state in which the power supply voltage VDD is transferred, and it is in the floating state.

In this state, the voltage on the control gate electrodes of unselected memory cell transistors M is set equal to the voltage Vpass, and the voltage on the control gate electrode of the selected memory cell transistor M is set equal to the voltage Vpgm.

As a result, the voltage on the channel of the NAND string is raised by coupling to the memory cell transistors M. The voltage on the channel is referred to as voltage Vinhibit.

In this state, a potential difference between the control gate electrode of the selected memory cell transistor M and the channel of the NAND string is small. Therefore, injection of electrons into the floating gate electrode FG is not conducted.

In this way, since injection of electrons is not conducted, the threshold voltage of the selected memory cell transistor M is located in the threshold distribution where the data "1" has been assigned as shown in FIG. 8.

The erase operation of the NAND flash memory will now be described.

Figure 15:
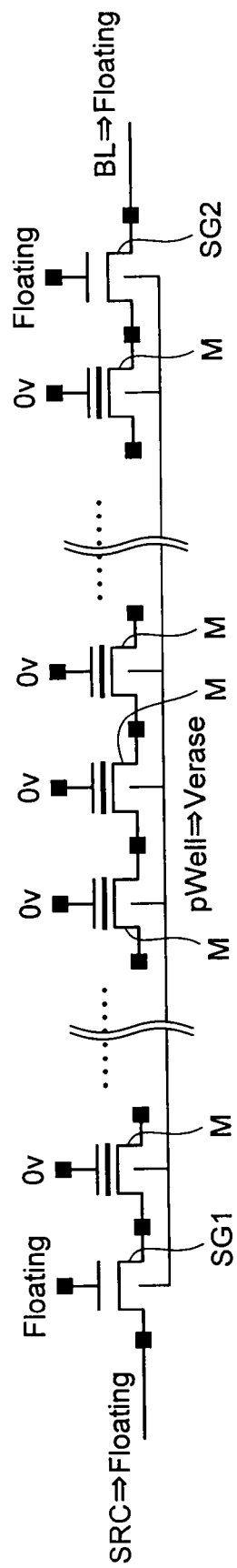
FIG. 15 is a diagram for explaining an example of erase operation of the NAND string in the case where data is to be erased in a selected block.
Figure 16:
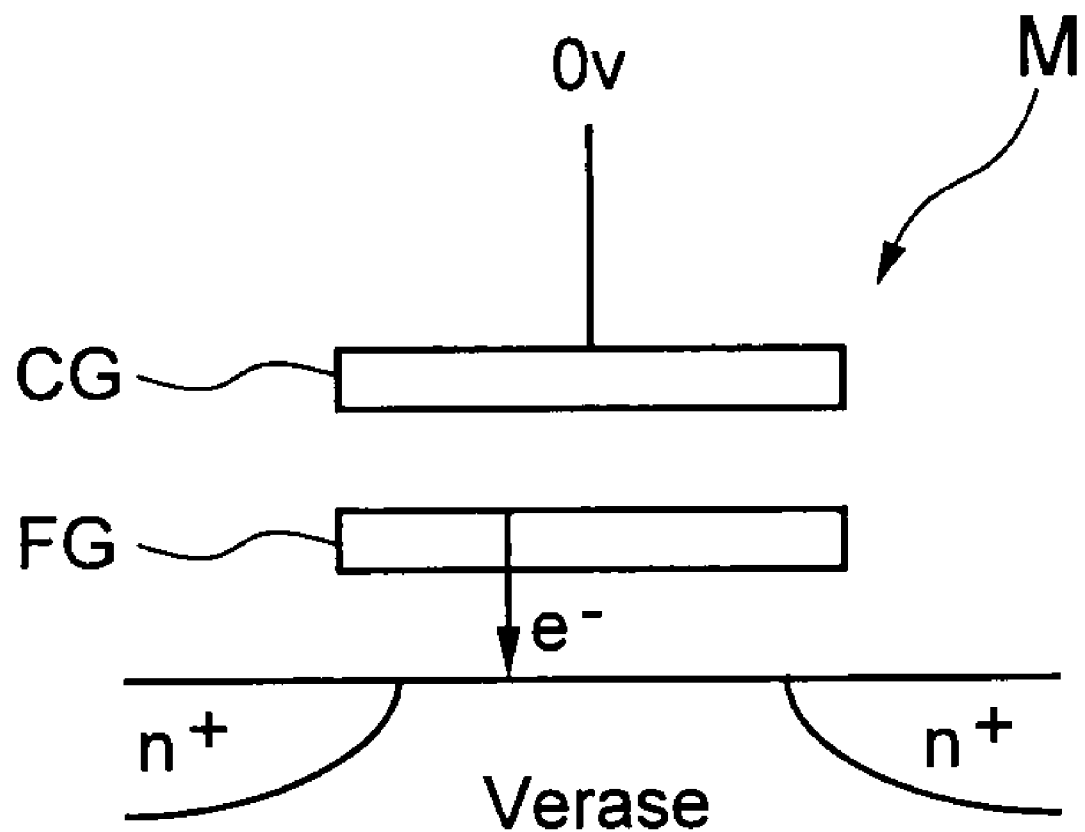
FIG. 16 is a diagram showing relations of potential in the case where data stored in memory cell transistors in a selected block is to be erased.
Figure 17:
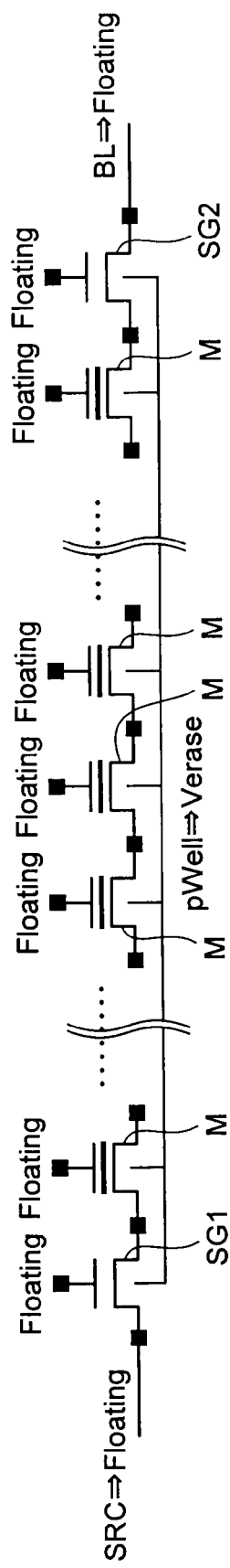
FIG. 17 is a diagram for explaining an example of operation in the case where data is not to be erased in an unselected block.
Figure 18:
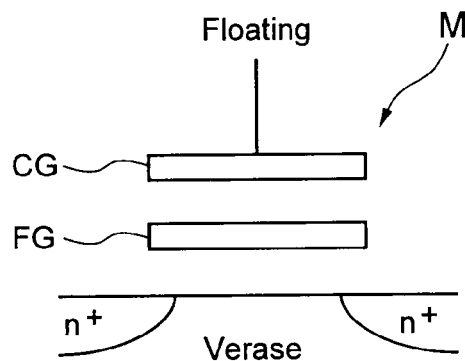
FIG. 18 is a diagram showing relations of potential of memory cell transistors in an unselected block.

FIG. 15 is a diagram for explaining an example of erase operation of the NAND string in the case where data is to be erased in a selected block. FIG. 16 is a diagram showing relations of potential in the case where data stored in memory cell transistors in a selected block is to be erased. FIG. 17 is a diagram for explaining an example of operation in the case where data is not to be erased in an unselected block. FIG. 18 is a diagram showing relations of potential of memory cell transistors in an unselected block.

In a selected block in which data stored in memory cell transistors M is to be erased, 0 V is applied to control gate electrodes of MOS transistors M in the selected block, as shown in FIG. 15. And the gates of the selection gate transistors SG1 and SG2, the bit line BL, and the source line SRC are brought into the floating state. Thereafter, the voltage on the substrate (well) p-well in the memory cell array is boosted to a voltage Verase (FIG. 16).

As a result, the potential difference between the voltage (=0 V) at the control gate electrode CG in the memory cell transistor M and the voltage (=Verase) at the substrate p-well is made large to emit electrons from the floating gate electrode FG.

At this time, gates of the selection gate transistors SG1 and SG2 are in the floating state. Therefore, the gate voltage is raised by coupling to the substrate (well) p-well. In addition, since potentials on the bit line BL and the source line SRC are raised by a forward bias of the junction, the potential difference from the substrate (well) p-well is small.

On the other hand, in unselected blocks in which data stored in the memory cell transistors M is not to be erased, control gate electrodes of MOS transistors M in each block are brought into the floating state. Gates of the selection gate transistors SG1 and SG2, the bit line BL, and the source line SRC are brought into the floating state. Thereafter, the voltage on the substrate (well) p-well in the memory cell array is raised to the voltage Verase (FIG. 18).

As a result, the voltage on the control gate electrode of the MOS transistor M is raised by coupling to the substrate (well) p-well. As a result, the potential difference between the gate and the substrate (well) p-well becomes small and electrons are not emitted from the floating gate electrode FG.

The operation described heretofore is a basic operation of the NAND flash memory.

Figure 19:
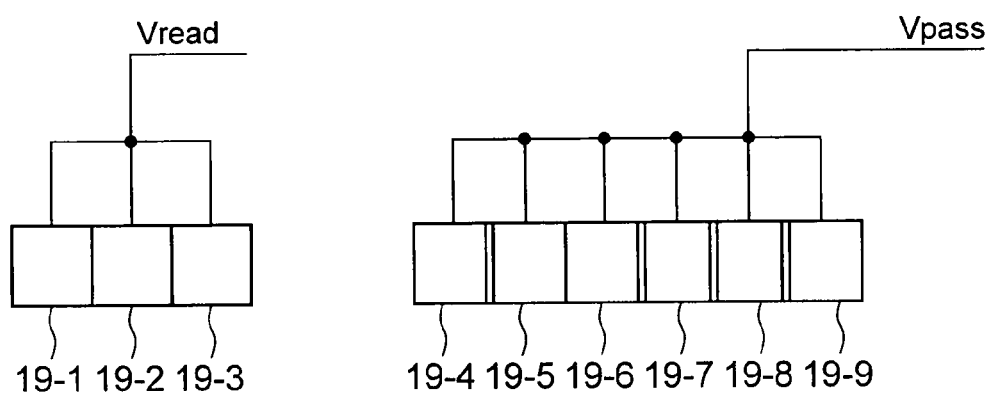
FIG. 19 is a block diagram showing an example of a configuration of a boosting circuit dedicated to the voltage Vread and a boosting circuit dedicated to the voltage Vpass, for two boosted voltages.

FIG. 19 is a block diagram showing an example of a configuration of a boosting circuit dedicated to the voltage Vread and a boosting circuit dedicated to the voltage Vpass, for two boosted voltages.

As shown in FIG. 19, three boosting circuits 19-1 to 19-3 dedicated to generating the voltage Vread and six boosting circuits 19-4 to 19-9 dedicated to generating the voltage Vpass are provided.

When the number of kinds of boosted voltages is small as in the above example, the degree of influence upon an increase of a chip area is not so large, even if voltages required for respective operations are generated from dedicated boosting circuits (boosting circuits which are set to optimum circuit constants).

Similarly, when the number of kinds of boosted voltages is small, the "chip area loss" is small, even if dedicated boosting circuits respective for the voltage Vread/Vpass are provided.

By the way, the "chip area loss" means that there is a boosting circuit which is not used in a certain operation state, for example, the Vpass pump is not used at the time of read operation and the Vread pump is not used at the time of write operation.

However, the NAND flash memory in recent years which needs various boosted voltages to ensure its reliability has a problem that the chip area increases by leaps and bounds if dedicated boosting circuits are generated respectively for boosted voltages set to various values.

In this way, the NAND flash memory needs various boosted voltages for respective operations. However, it is not always necessary that each boosted voltage requires a dedicated boosting circuit, in one-to-one correspondence.

For example, the Vread pump (the pump for generating Vread) which becomes necessary at the time of read operation is not required at the time of writing. And the Vpass pump (the pump for generating Vpass) which becomes necessary at the time of write operation is not required at the time of reading.

Figure 20:
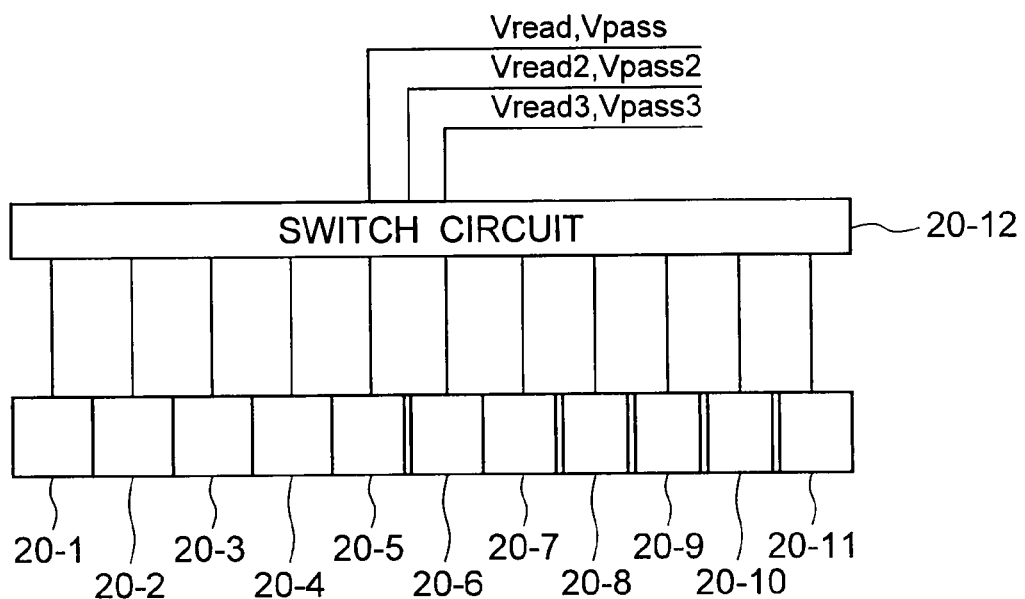
FIG. 20 is a block diagram showing an example of a configuration of boosting circuits for six boosted voltages.

FIG. 20 is a block diagram showing an example of a configuration of boosting circuits for six boosted voltages.

As shown in FIG. 20, eleven shared boosting circuits 20-1 to 20-11 are provided to generate voltages Vread, Vread2, Vread3, Vpass, Vpass2 and Vpass3. The voltages boosted by the boosting circuits 20-1 to 20-11 are changed over by a switch circuit 20-12 and output as one of the voltages Vread, Vread2, Vread3, Vpass, Vpass2 and Vpass3.

In recent years, an increase of the chip area is suppressed by sharing the boosting circuits in this way.

However, the configuration of sharing the boosting circuits is not always an optimum circuit configuration from the viewpoint of the current dissipation or the peak current.

Figure 21:
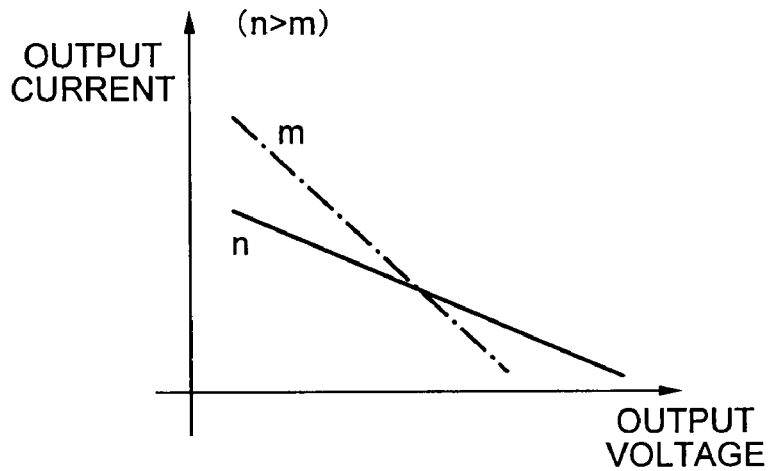
FIG. 21 is a diagram showing IV characteristics of a typical Dickson-type boosting circuit.
Figure 22:
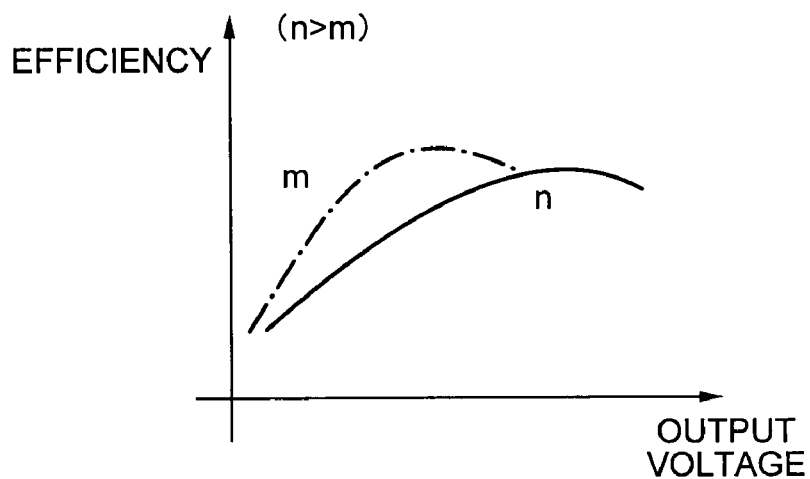
FIG. 22 is a diagram showing power efficiency characteristics of the typical Dickson-type boosting circuit.

FIG. 21 is a diagram showing IV characteristics of a typical Dickson-type boosting circuit. FIG. 22 is a diagram showing power efficiency characteristics of the typical Dickson-type boosting circuit.

As shown in FIG. 21, it is necessary to increase the number of stages of diode-connected transistors shown in, for example, FIG. 2 for generating a high voltage (according to Expression (5) already described).

For example, it is supposed that the voltage Vpass needed at the time of writing is set equal to 10 V and the voltage Vread needed at the time of reading is set equal to 4 V. For sharing boosting circuits which generate these voltages in this case, it is necessary to have diode-connected transistors having n stages capable of outputting the voltage Vpass which is a high voltage.

Accordingly, at the time of reading from the NAND flash memory, the voltage Vread is output by a boosting circuit which is formed by multi-stage connection of the diode-connected transistors.

As shown in FIG. 22, however, the power efficiency is degraded when the multi-stage connected boosting circuit outputs a low voltage.

In other words, when the voltage Vread is output from a boosting circuit (having n output stages, where n>m) in which circuit constants is optimized exclusively for the voltage Vpass, the power efficiency is degraded as compared to a case where the voltage Vread is output from a boosting circuit (having m output stages, where n>m) in which circuit constants is optimized exclusively for the voltage Vread.

And for obtaining the same output current as that in the case of the optimized boosting circuit, the number of boosting circuits needs to be increased to cover the degradation of the power efficiency. Since the number of boosting circuits which operate at the same time increases, an increase of the peak current and an increase of current dissipation are caused.

Furthermore, in the Dickson-type boosting circuit, the output cannot be taken out from the middle of the output stage (diode-connected stage).

The reason will now be described. Supposing that a terminal node 2a and a terminal node 2b are short-circuited to each other and an output is taken out from a middle of the output stage, booting of Cb2a and Cb2b by a driver DA and a driver DB is conducted by clocks of opposite phases. Therefore, a boosting operation and a bucking operation collide with each other by coupling, resulting in remarkable efficiency down.

In the conventional Dickson-type boosting circuit, therefore, the increase of the chip area caused by an increase of boosted voltage circuits can be suppressed by making a contrivance of the control method such as sharing of boosted voltages.

However, the number of output stages of boosting circuits (the number of stages conformed to the highest output level among shared boosted voltages) is fixed by sharing the boosted voltages.

When outputting a low voltage from the shared boosted voltage, therefore, the current dissipation and peak current increase.

In recent years, a larger number of boosted voltages are used for enhancing the reliability of the cell, as previously described. The tendency of the higher current dissipation and peak current has been more and more obvious.

This increase of the current dissipation and the peak current is a noise source for not only the NAND flash memory but also a system using the NAND flash memory, resulting in a great problem.

Therefore, it is extremely important to decrease the current dissipation and peak current caused by the boost circuit operation besides making the chip area small.

As shown in the comparative example already described, there is a close relationship between the number of stages of the boosting circuit and the load characteristics (IV) as well as between the number of stages of the boosting circuit and the power efficiency (FIG. 21 and FIG. 22).

In a boosting circuit according to the present invention, therefore, the number of stages (the number of diode-connected transistors) of the boosting circuit is varied depending on whether a high voltage is output or a low voltage is output.

As a result, it is possible to share boosted voltages of several kinds without degrading the efficiency when outputting a low voltage (without increasing the current dissipation/peak current) and without increasing the chip area, even if sharing of the boosting circuit is conducted.

Hereafter, embodiments according to the present invention will be described more specifically with reference to the drawings.

First Embodiment

Figure 23:
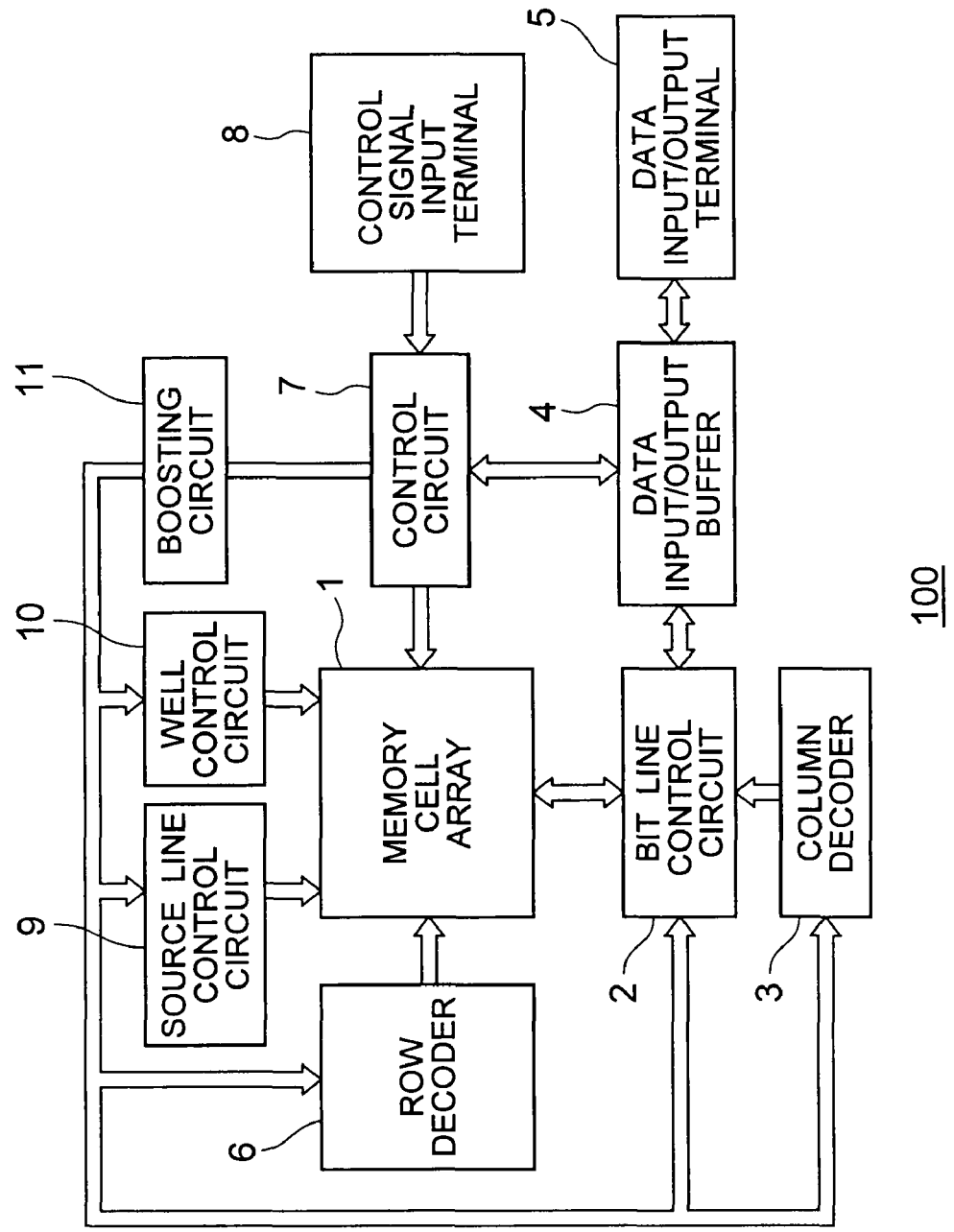
FIG. 23 is a block diagram showing an example of a configuration of a semiconductor storage device 100 according to a first embodiment of the present invention.

FIG. 23 is a block diagram showing an example of a configuration of a semiconductor storage device 100 according to a first embodiment of the present invention.

As shown in FIG. 23, a semiconductor storage device 100, which is a NAND flash memory, includes a memory cell array 1, a bit line control circuit 2, a column decoder 3, a data input/output buffer 4, a data input/output terminal 5, a row decoder 6, a control circuit 7, a control signal input terminal 8, a source line control circuit 9, a well control circuit 10, and a boosting circuit 11.

The memory cell array 1 includes a plurality of bit lines, a plurality of word lines, and a source line. The memory cell array 1 is formed of a plurality of blocks (not illustrated) each obtained by arranging a plurality of memory cell transistors each of which is formed of, for example, an EEPROM cell and can be electrically rewritten in data, in a matrix form.

The bit line control circuit 2 for controlling voltages on the bit lines and the row decoder 6 for controlling voltages on the word lines are connected to the memory cell array 1. At the time of data erase operation, a certain block is selected by the row decoder 6 and remaining blocks are made unselected.

The bit line control circuit 2 includes a sense amplifier (not illustrated) which senses and amplifies a voltage on a bit line in the memory cell array 1, and a data storage circuit (not illustrated) which plays a role as a data latch circuit for latching data to be written, as well.

The bit line control circuit 2 reads out data in a memory cell transistor in the memory cell array 1 via a bit line, detects a state of the memory cell transistor via a bit line, and apply a write control voltage to the memory cell transistor via a bit line to write data into the memory cell transistor.

The column decoder 3 and the data input/output buffer 4 are connected to the bit line control circuit 2. The data storage circuit in the bit line control circuit 2 is selected by the column decoder 3, and data in the memory cell transistor read out into the data storage circuit is output from the data input/output terminal 5 to the outside via the data input/output buffer 4.

Write data which is input from the outside to the data input/output terminal 5 is stored in the data storage circuit selected by the column decoder 3, via the data input/output buffer 4.

The row decoder 6 is connected to the memory cell array 1. The row decoder 6 applies a voltage, which is required to read, write or erase data, to a word line connected to a control gate of a memory cell transistor in the memory cell array 1.

The source line control circuit 9 is connected to the memory cell array 1. The source line control circuit 9 is adapted to control a voltage on a source line.

The well control circuit 10 is connected to the memory cell array 1. The well control circuit 10 is adapted to control a voltage on a semiconductor substrate (well) on which a memory cell transistor is formed.

The control circuit 7 is adapted to control the memory cell array 1, the bit line control circuit 2, the column decoder 3, the data input/output buffer 4, the row decoder 6, the source line control circuit 9 and the well control circuit 10.

The control circuit 7 is adapted to control the boosting circuit 11 by using, for example, a clock signal, a control signal or the like to boost the power supply voltage as occasion demands, and supply the boosted voltages to the bit line control circuit 2, the column decoder 3, the data input/output buffer 4, the row decoder 6, the source line control circuit 9 and the well control circuit 10.

The control circuit 7 conducts control operation according to a control signal (command) which is input from the outside via the control signal input terminal 8. In other words, the control circuit 7 generates predetermined voltages by using the boosting circuit 11 according to the control signal at the time of data programming, verifying, reading or erasing, and supplies the predetermined voltages to various parts in the memory cell array 1.

Figure 24:
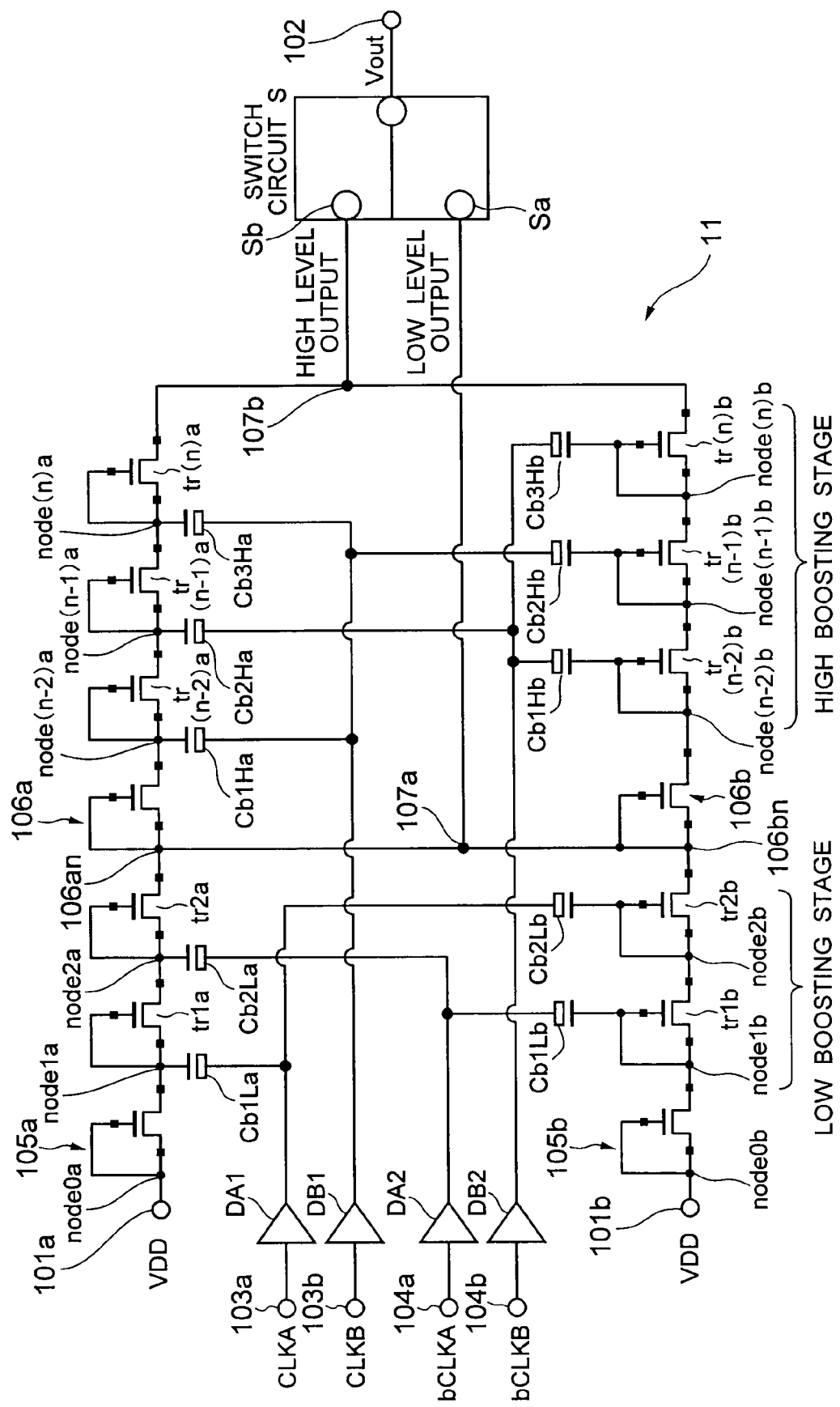
FIG. 24 is a circuit diagram showing an example of a circuit configuration of the boosting circuit 11 in the NAND flash memory 100 shown in FIG. 23.

FIG. 24 is a circuit diagram showing an example of a circuit configuration of the boosting circuit 11 in the NAND flash memory 100 shown in FIG. 23.

As shown in FIG. 24, the boosting circuit 11 is adapted to boost a power supply voltage VDD applied to power supply terminals 101a and 101b and output a boosted voltage Vout from an output terminal 102.

The boosting circuit 11 includes: first to fourth clock terminals 103a, 104a, 103b and 104b; first to fourth rectification elements 105a, 105b, 106a and 106b; MOS transistors for low boosting stage tr1a, tr1b, tr2a and tr2b; capacitors for low boosting stage Cb1La, Cb1Lb, Cb2La and Cb2Lb; MOS transistors for high boosting stage tr(n−2)a, tr(n−2)b, tr(n−1)a, tr(n−1)b, tr(n)a and tr(n)b; capacitors for high boosting stage Cb1Ha, Cb1Hb, Cb2Ha, Cb2Hb, Cb3Ha and Cb3Hb; first to fourth drivers DA1, DA2, DB1 and DB2; and a switch circuit S.

The first clock terminal 103a is adapted to be supplied with a first clock signal CLKA.

The second clock terminal 104a is adapted to be supplied with a second clock signal bCLKA. The second clock signal bCLKA has a phase which is the inverse of that of the first clock signal CLKA. The second clock signal bCLKA has the same amplitude ampa and the same period fosca as those of the first clock signal CLKA.

The third clock terminal 103b is adapted to be supplied with a third clock signal CLKB.

The fourth clock terminal 104b is adapted to be supplied with a fourth clock signal bCLKB. The fourth clock signal bCLKB has a phase which is the inverse of that of the third clock signal CLKB. The fourth clock signal bCLKB has the same amplitude ampb and the same period foscb as those of the third clock signal CLKB.

By the way, the first to fourth clock signals CLKA, bCLKA, CLKB and bCLKB are supplied from the control circuit 7 as already described. The control circuit 7 sets, for example, the period fosca of the first and second clock signals CLKA and bCLKA to a value which is less than the period foscb of the third and fourth clock signals CLKB and bCLKB. Furthermore, the control circuit 7 sets, for example, the third and fourth clock signals CLKB and bCLKB to have amplitude greater than that of the first and second clock signals CLKA and bCLKA.

The first driver DA1 is connected between the first clock terminal 103a and the capacitor Cb1La. The first driver DA1 is adapted to amplify the amplitude of the first clock signal CLKA.

The second driver DA2 is connected between the second clock terminal 104a and the capacitor Cb1Lb. The second driver DA2 is adapted to amplify the amplitude of the second clock signal bCLKA.

The third driver DB1 is connected between the third clock terminal 103b and the capacitor Cb1Ha. The third driver DB1 is adapted to amplify the amplitude of the third clock signal CLKB.

The fourth driver DB2 is connected between the fourth clock terminal 104b and the capacitor Cb1Hb. The fourth driver DB2 is adapted to amplify the amplitude of the fourth clock signal bCLKB.

The first rectification element 105a is connected at its first end to a first power supply terminal 101a (a terminal node 0a) supplied with the power supply voltage VDD.

The second rectification element 105b is connected at its first end to a second power supply terminal 101b (a terminal node 0b) supplied with the power supply voltage VDD.

The MOS transistor tr1a is connected at its first end to a second end (a terminal node 1a) of the first rectification element 105a, and is diode-connected.

The capacitor Cb1La is connected between a gate of the MOS transistor tr1a and the first clock terminal 103a (an output of the first driver DA1).

The MOS transistor tr2a is connected at its first end to a second end (a terminal node 2a) of the MOS transistor tr1a, and is diode-connected.

The capacitor Cb2La is connected between a gate of the MOS transistor tr2a and the second clock terminal 104a (an output of the second driver DA2).

The MOS transistor tr1b is connected at its first end to a second end (a terminal node 1b) of the second rectification element 105b, and is diode-connected.

The capacitor Cb1Lb is connected between a gate of the MOS transistor tr1b and the second clock terminal 104a (an output of the second driver DA2).

The MOS transistor tr2b is connected at its first end to a second end (a terminal node 2b) of the MOS transistor tr1b, and is diode-connected.

The capacitor Cb2Lb is connected between a gate of the MOS transistor tr2b and the first clock terminal 103a (the output of the first driver DA1).

In the example shown in FIG. 24, the low boosting stage is formed of boosting stages of two stages corresponding to two phases, each including two capacitors for booting and two diode-connected MOS transistors. However, the low boosting stage may be formed of one stage, three stages, or more than three stages.

The third rectification element 106a is connected at its first end to the second end (the terminal node 2a) of the MOS transistor tr1a via the MOS transistor tr2a.

The fourth rectification element 106b is connected at its first end to the second end (the terminal node 2b) of the MOS transistor tr1b via the MOS transistor tr2b.

As shown in FIG. 24, each of the first to fourth rectification elements 105a, 105b, 106a and 106b is formed of, for example, a diode-connected MOS transistor.

The MOS transistor tr(n−2)a is connected at its first end to a second end (a terminal node (n−2)a) of the third rectification element 106a, and is diode-connected.

The capacitor Cb1Ha is connected between a gate of the MOS transistor tr(n−2)a and the third clock terminal 103b (an output of the third driver DB1).

The MOS transistor tr(n−1)a is connected at its first end to a second end (a terminal node (n−1)a) of the MOS transistor tr(n−2)a, and is diode-connected.

The capacitor Cb2Ha is connected between a gate of the MOS transistor tr(n−1)a and the fourth clock terminal 104b (an output of the fourth driver DB2).

The MOS transistor tr(n)a is connected at its first end to a second end (a terminal node (n) a) of the MOS transistor tr(n−1)a, and is diode-connected.

The capacitor Cb3Ha is connected between a gate of the MOS transistor tr(n)a and the third clock terminal 103b (an output of the third driver DB1).

The MOS transistor tr(n−2)b is connected at its first end to a second end (a terminal node (n−2)b) of the fourth rectification element 106b, and is diode-connected.

The fourth capacitor Cb1Hb is connected between a gate of the MOS transistor tr(n−2)b and the fourth clock terminal 104*b* (the output of the fourth driver DB2).

The MOS transistor tr(n−1)b is connected at its first end to a second end (a terminal node (n−1)b) of the MOS transistor tr(n−2)b, and is diode-connected.

The capacitor Cb2Hb is connected between a gate of the MOS transistor tr(n−1)b and the third clock terminal 103*b* (the output of the third driver DB1).

The MOS transistor tr(n)b is connected at its first end to a second end (a terminal node (n) b) of the MOS transistor tr(n−1)b, and is diode-connected.

The capacitor Cb3Hb is connected between a gate of the MOS transistor tr(n)b and the fourth clock terminal 104*b* (the output of the fourth driver DB2).

In the example shown in FIG. 24, the high boosting stage is formed of boosting stages of three stages corresponding to two phases, each including three capacitors for booting and three diode-connected MOS transistors. However, the high boosting stage may be formed of one stage, two stages, four stages or more than four stages.

Furthermore, in the example shown in FIG. 24, each capacitor for booting is formed of a device obtained by connecting a source of a MOS transistor to its drain. However, each capacitor for booting may be formed of another device.

The switch circuit S has a low level terminal Sa and a high level terminal Sb. The low level terminal Sa is connected to a first connection node 107*a* between the first end (a terminal 106*an*) of the third rectification element 106*a* and the first end (a terminal 106*bn*) of the fourth rectification element 106*b*. The high level terminal Sb is connected to a second connection node 107*b* between a second end of the MOS transistor tr(n−2)a (a second end of the MOS transistor tr(n)a) and a second end of the MOS transistor tr(n−2)b (a second end of the MOS transistor tr(n)b).

The switch circuit S is adapted to change over between a high level voltage (a first voltage) at the high level terminal Sb and a low level voltage (a second voltage which is lower than the first voltage (the high level voltage)) at the low level terminal Sa, and output a resultant voltage to the output terminal 102 as the output voltage Vout. By the way, the low level voltage corresponds to, for example, the already described voltage Vread, whereas the high level voltage corresponds to, for example, the already described voltage Vpass.

An example of operation of the boosting circuit 11 having the configuration described heretofore will now be described.

Figure 25:
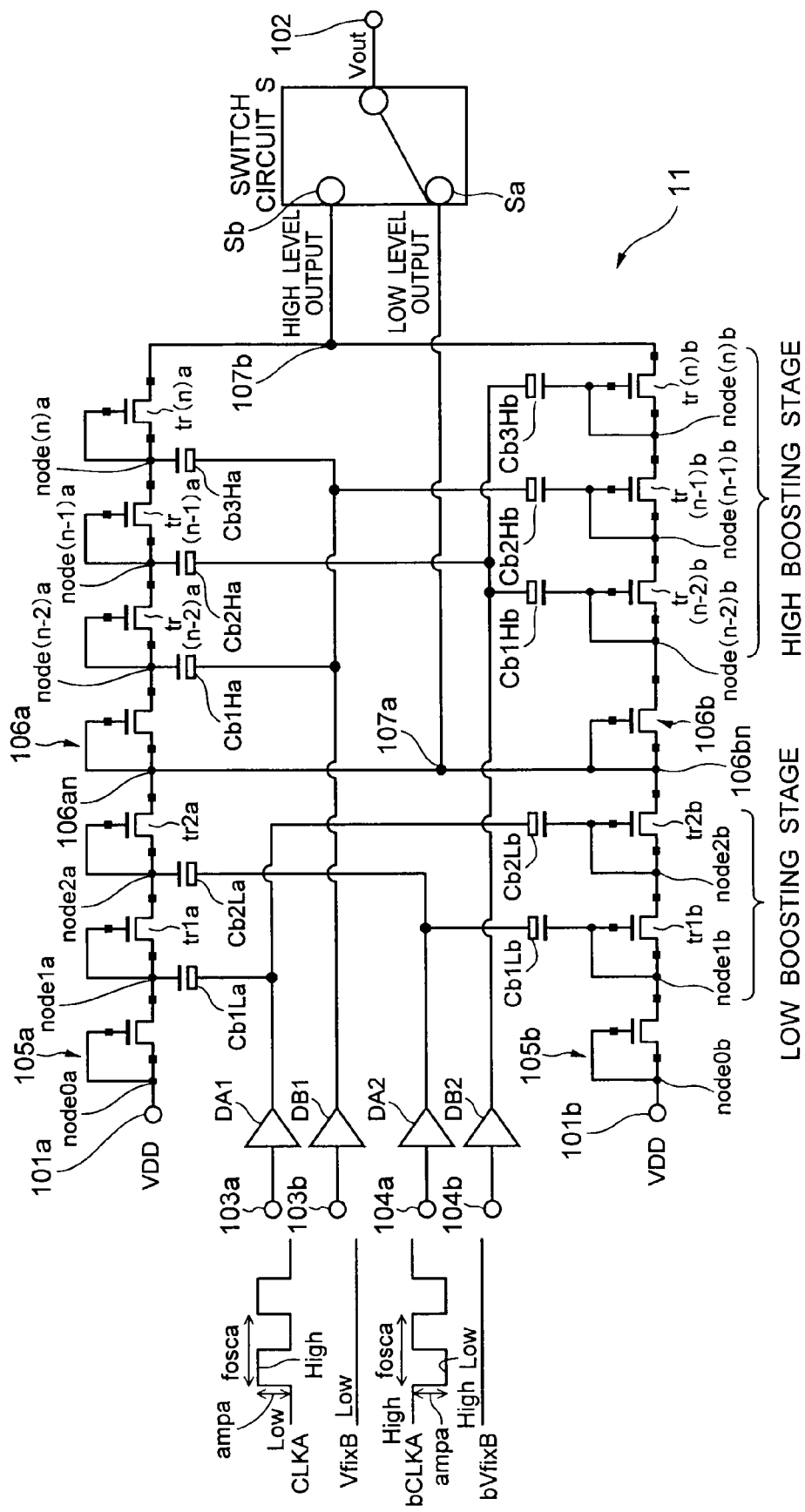
FIG. 25 is a diagram for explaining operation conducted when the boosting circuit 11 shown in FIG. 24 outputs the low level voltage.
Figure 26:
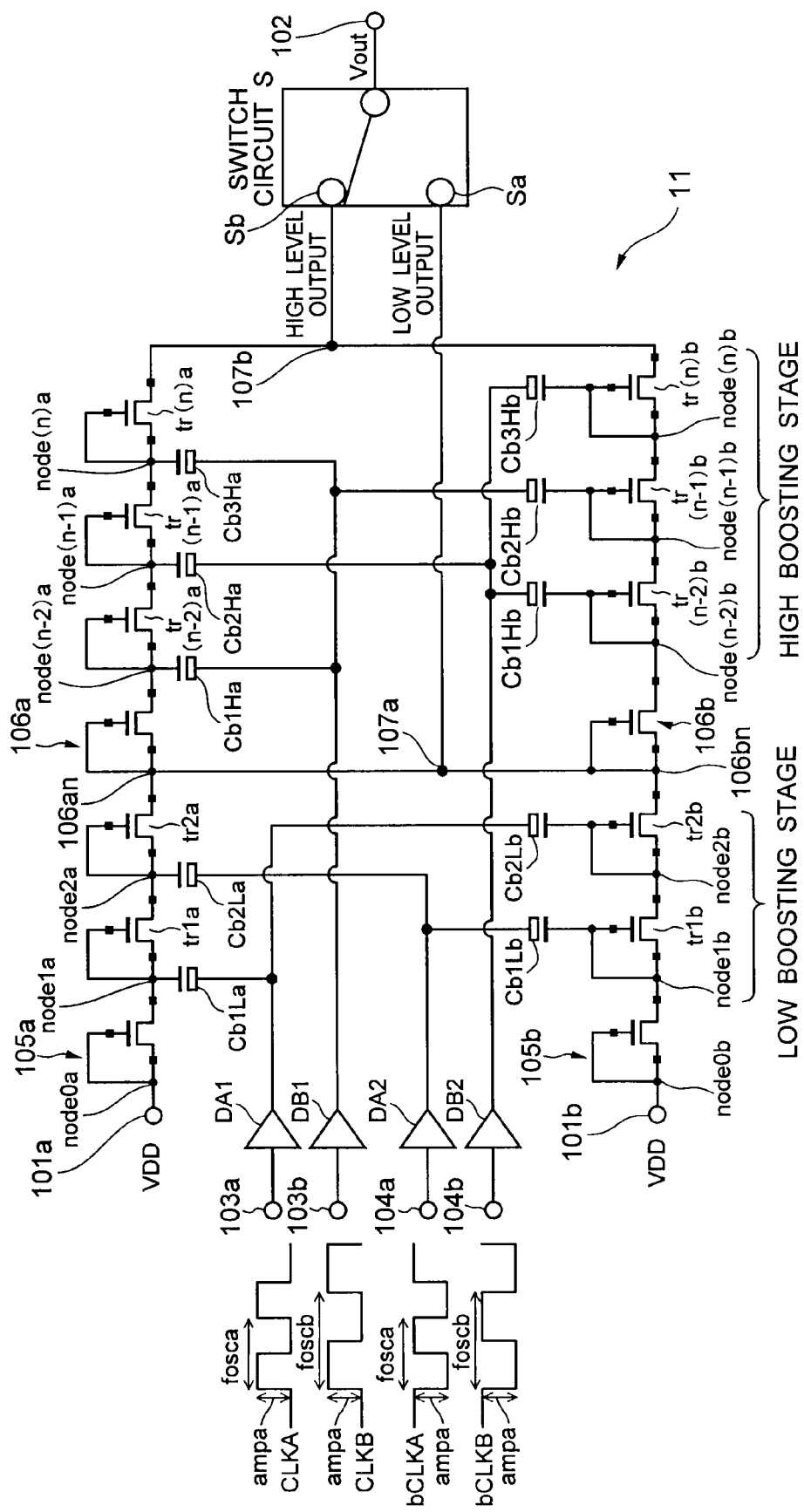
FIG. 26 is a diagram for explaining operation conducted when the boosting circuit 11 shown in FIG. 24 outputs the high level voltage.

FIG. 25 is a diagram for explaining operation conducted when the boosting circuit 11 shown in FIG. 24 outputs the low level voltage. FIG. 26 is a diagram for explaining operation conducted when the boosting circuit 11 shown in FIG. 24 outputs the high level voltage. As already described, the low level voltage (the second voltage) is set to be lower than the high level voltage (the first voltage).

When outputting the low level voltage, the first and second clock signals CLKA and bCLKA which are output from the control circuit 7 are input to the first and second clock terminals 103*a* and 104*a*. In addition, instead of the third and fourth clock signals CLKB and bCLKB, a "low" level fixed voltage VfixB and a "high" level fixed voltage bVfixB which are output from the control circuit 7 are input to the third and fourth clock terminals 103*b* and 104*b*.

Consequently, the low boosting stage in the boosting circuit 11 conducts boosting operation according to the first and second clock signals CLKA and bCLKA, and outputs the generated low level voltage to the low level terminal Sa. On the other hand, since any clock signal is not input to the high boosting stage in the boosting circuit 11, the high boosting stage in the boosting circuit 11 does not conduct boosting operation. At this time, the switch circuit S outputs the low level voltage at the low level terminal Sa to the output terminal 102.

As described above, when outputting the low level voltage, the operation of the high boosting stage in the boosting circuit 11 is in the stopped state. As a result, it is possible to stop wasteful charging and discharging, and improve the power efficiency of the boosting circuit 11. Furthermore, the output current can be increased by decreasing the number of stages in operation (the number of diode-connected stages) (FIG. 21).

On the other hand, when outputting the high level voltage, the first to fourth clock signals CLKA, bCLKA, CLKB and bCLKB which are output from the control circuit 7 are input to the first to fourth clock terminals 103*a*, 104*a*, 103*b* and 104*b* as shown in FIG. 26.

As a result, the low boosting stage in the boosting circuit 11 conducts boosting operation according to the first and second clock signals CLKA and bCLKA, and outputs the generated low level voltage to the high boosting stage. In addition, the high boosting stage in the boosting circuit 11 conducts boosting operation according to the third and fourth clock signals CLKB and bCLKB, and outputs the generated high level voltage to the high level terminal Sb.

Consequently, the switch circuit S outputs the high level voltage at the high level terminal Sb to the output terminal 102.

When outputting the high level, both the low boosting stage and the high boosting stage in the boosting circuit 11 are activated, and the high level voltage is output by using all output stages (all diode-connected stages) as in the conventional art.

By the way, the control circuit 7 configures, for example, the third clock signal CLKB and the fourth clock signal bCLKB to have larger amplitude than that of the first clock signal CLKA and the second clock signal bCLKA.

As a result, the boosting capability of the high boosting stage in the boosting circuit 11 can be enhanced.

Furthermore, as already described, the control circuit 7 sets, for example, the period fosca of the first and second clock signals CLKA and bCLKA equal to a value which is less than the period of the third and fourth clock signals CLKB and bCLKB.

As a result, the boosting capability of the low boosting stage in the boosting circuit 11 can be enhanced.

By the way, the first and second drivers DA1 and DA2 are circuits equivalent to circuits obtained by dividing the driver DA shown in FIG. 2. In addition, the third and fourth drivers DB1 and DB2 are circuits equivalent to circuits obtained by dividing the driver DB shown in FIG. 2. In other words, the circuit area of the drivers themselves as a whole is equal to the circuit area of the drivers as a whole in the comparative example.

Therefore, an increase of area of the boosting circuit 11 according to the first embodiment as compared with the comparative example already described is equal to an area of an inserted single stage transistor as well as an area required to divide the drivers and capacitors for booting, and it is minute.

In the boosting circuit 11 in FIG. 24, only bisection into the low boosting stage and the high boosting stage is shown as an example. However, the boosting circuit 11 may be divided into n stages by inserting n rectification elements.

As described heretofore, the number of output stages in the boosting circuit is made variable according to the output voltage level, with a slight area increase of the boosting circuit 11.

Accordingly, it becomes possible to set an optimum number of pumps/an optimum number of output stages (an optimum efficiency) conformed to the level which is output by the boosting circuit.

Therefore, it becomes possible to reduce the current dissipation and peak current when outputting a low level from a boosting circuit of one kind shared by a large number of boosted voltages which differ in output level to reduce the chip area.

Figure 27:
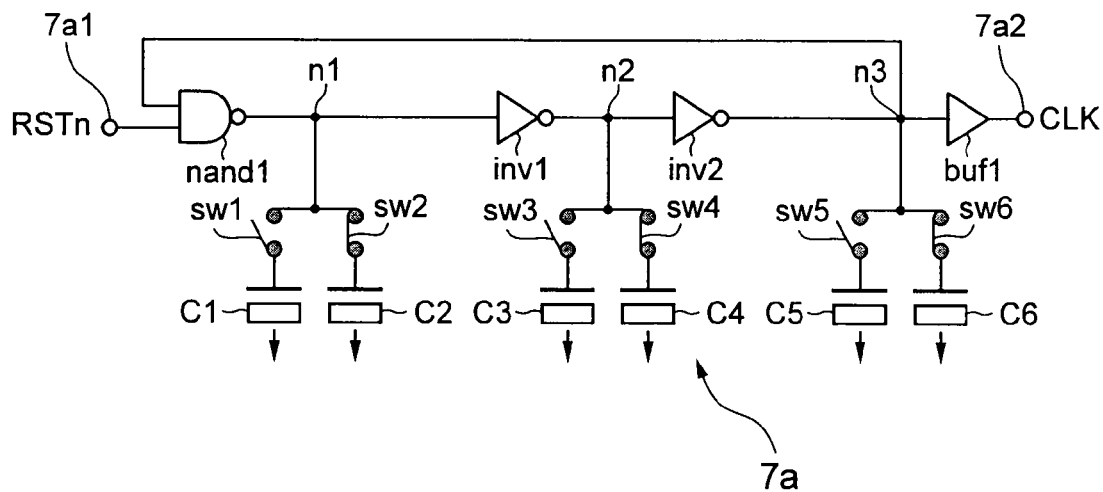
FIG. 27 is a circuit diagram showing an example of a circuit configuration of a clock signal generation circuit 7a which generates a clock signal to be supplied to the boosting circuit 11 shown in FIG. 24.

FIG. 27 is a circuit diagram showing an example of a circuit configuration of a clock signal generation circuit 7a which generates a clock signal to be supplied to the boosting circuit 11 shown in FIG. 24.

As shown in FIG. 27, the clock signal generation circuit 7a includes a NAND circuit nand1, inverters inv1 and inv2, a buffer buf1, switch circuits sw1 to sw6, and capacitors C1 to C6. The clock signal generation circuit 7a is adapted to output a clock signal CLK to a terminal 7a2 according to a reset signal RSTn which is input via a terminal 7a1.

A plurality of the clock signal generation circuits 7a are provided in, for example, the control circuit 7 shown in FIG. 23. And the reset signal RSTn is input to the control circuit 7 via, for example, the control signal input terminal 8 shown in FIG. 23.

An example of operation conducted by the clock signal generation circuit 7a having the configuration described heretofore will now be described.

First, the control circuit 7 sets the reset signal RSTn to the "low" level as an initializing signal. At this time, voltages at terminals n1, n2 and n3 in the clock signal generation circuit 7a assume the "high" level, the "low" level and the "high" level, respectively.

Then, the control circuit 7 changes over the reset signal RSTn from this state to the "high" level. As a result, the voltage at the terminal n1 in the clock signal generation circuit 7a becomes the "low" level, the voltage at the terminal n2 becomes the "high" level, and the voltage at the terminal n3 becomes the "low" level.

The "low" level of the voltage at the terminal n3 is input to the NAND circuit nand1. As a result, the voltage at the terminal n1 becomes the "high" level, the voltage at the terminal n2 becomes the "low" level and the voltage at the terminal n3 becomes the "high" level.

The clock signal CLK having a definite period is generated by repeatedly continuing the operation of the clock signal generation circuit 7a.

Furthermore, the clock signal generation circuit 7a can adjust capacitance loads by controlling on/off of the switch circuits sw1 to sw6, and can generate clock signals (the first to fourth clock signals CLKA, bCLKA, CLKB and bCLKB) having arbitrary frequencies.

With respect to a voltage which is output from the boosting circuit 11, an optimum value of the output current differs according to the frequency of the clock signal which is input thereto. Therefore, the clock signal generation circuit 7a generates a plurality of clock signals having different frequencies and supplies the clock signals to the boosting circuit 11.

As a result, operation at an arbitrary frequency is possible for every number of stages in the boosting circuit. Furthermore, the frequency of the clock signal can be changed over, for example, depending on whether to output the low level (FIG. 25) or output the high level (FIG. 26). Furthermore, in the case of the high level output (FIG. 26), the frequency of a clock signal which is input to the low boosting stage in the boosting circuit 11 and the frequency of a clock signal which is input to the high boosting stage can be made different from each other.

Therefore, operation of the boosting circuit 11 with a high efficiency and low current dissipation becomes possible.

Figure 28:
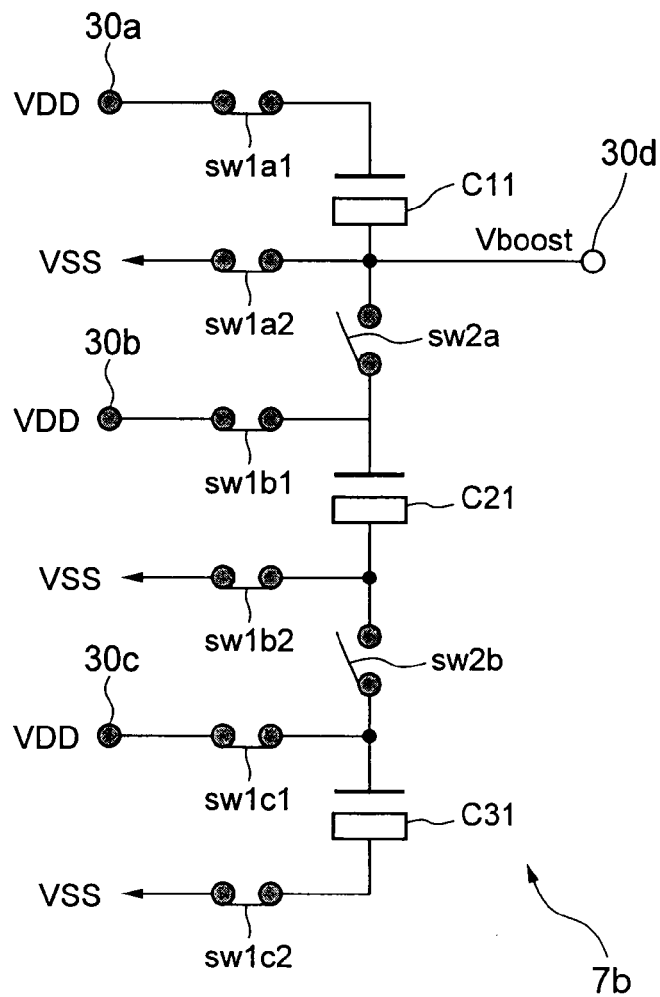
FIG. 28 is a circuit diagram showing an example of a circuit configuration of an amplitude adjustment circuit 7b which adjusts amplitude of a clock signal supplied to the boosting circuit 11 shown in FIG. 24.
Figure 29:
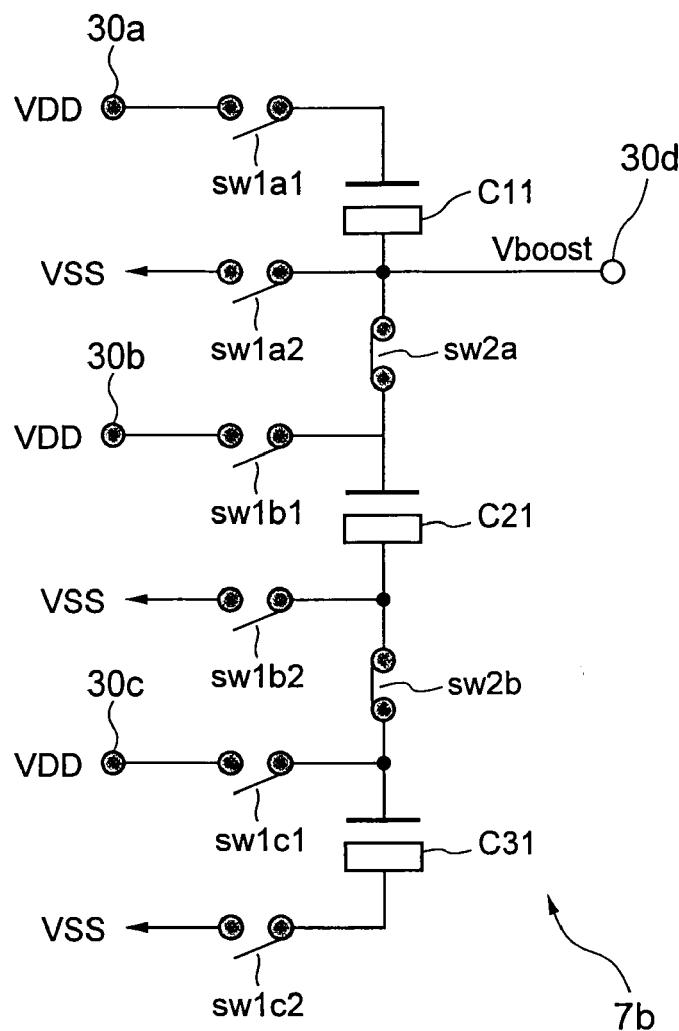
FIG. 29 is a circuit diagram for explaining a case where the amplitude adjustment circuit 7b shown in FIG. 28 outputs the "high" level of the clock signal.
Figure 30:
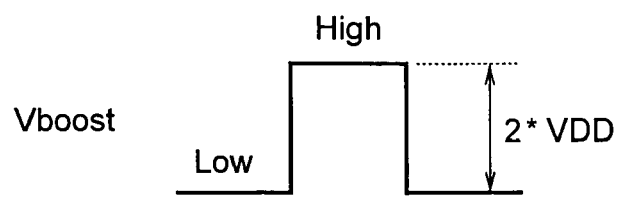
FIG. 30 is a diagram showing an example of a waveform of the clock signal which is output from the amplitude adjustment circuit 7b shown in FIG. 28.

FIG. 28 is a circuit diagram showing an example of a circuit configuration of an amplitude adjustment circuit 7b which adjusts amplitude of a clock signal supplied to the boosting circuit 11 shown in FIG. 24. FIG. 29 is a circuit diagram for explaining a case where the amplitude adjustment circuit 7b shown in FIG. 28 outputs the "high" level of the clock signal. FIG. 30 is a diagram showing an example of a waveform of the clock signal which is output from the amplitude adjustment circuit 7b shown in FIG. 28.

As shown in FIG. 28, the amplitude adjustment circuit 7b includes: switch circuits sw1a1, sw1b1, sw1c1, sw1a2, sw1b2, sw1c2, sw2a and sw2b; and capacitors C11, C21 and C31. Furthermore, the power supply voltage VDD is applied to terminals 30a to 30c.

A plurality of the amplitude adjustment circuits 7b are provided in, for example, the control circuit 7 shown in FIG. 23.

An example of operation of the amplitude adjustment circuit 7b having the configuration described heretofore will now be described. In this example, it is supposed that the amplitude of the clock signal is adjusted to be twice as large as that of the power supply voltage VDD.

First, as shown in FIG. 28, the switch circuits sw1a1, sw1b1, sw1c1, sw1a2, sw1b2 and sw1c2 are brought into the conduction state whereas sw2a and sw2b are brought into the open state.

As a result, charge Q (=C*VDD) is stored on each of capacitors C11, C21 and C31 (each having a capacitance value C). At this time, the voltage at a terminal 30d is a ground voltage VSS. In other words, the amplitude adjustment circuit 7b outputs the "low" level of the clock signal.

Then, as shown in FIG. 29, the switch circuits sw1a1, sw1b1, sw1c1, sw1a2, sw1b2 and sw1c2 are brought into the open state whereas sw2a and sw2b are brought into the conduction state.

At this time, it is supposed that there is no parasitic capacitance for brevity. The voltage at the terminal 30d is boosted to twice the power supply voltage VDD according to the law of conservation of charge. In other words, the amplitude adjustment circuit 7b outputs the "high" level of the clock signal.

If, for example, the number of capacitors connected in series is increased in the amplitude adjustment circuit 7b is increased, a clock signal having amplitude of voltage which is x times the power supply voltage VDD.

In this way, the amplitude adjustment circuit 7b controls the switch circuits sw1a1, sw1b1, sw1c1, sw1a2, sw1b2, sw1c2, sw2a and sw2b in synchronism with, for example, a clock signal generated by the clock signal generation circuit 7a. As a result, a clock signal having the same period as that of the clock signal generated by the clock signal generation circuit 7a and having amplitude (Vboost) which is twice the amplitude of the power supply voltage is output to the terminal 30d. The control circuit 7 supplies the clock signal which is output to the terminal 30d to the boosting circuit 11 as one of the first to fourth clock signals CLKA, bCLKA, CLKB and bCLKB.

Typically in the boosting circuit, it is necessary to increase the number of stages as the output voltage is set to be higher. In addition, a great back bias is applied to a MOS transistor on the latter stage side (output side). As a result, the threshold voltage of the MOS transistor becomes high. Therefore, it is necessary to raise the amplitude of the clock signal supplied to the output stage on the latter stage side.

In contrast, if the output voltage is low (the number of stages in the boosting circuit is small), the back bias applied to a MOS transistor on the latter stage side becomes small and the rise of the threshold voltage also becomes small. Therefore, it is not necessary to raise the amplitude of the clock signal supplied to the output stage.

In this way, the optimum amplitude of the clock signal differs according to the level of the output voltage of the boosting circuit (i.e., the number of stages in the boosting circuit).

Therefore, the power efficiency of the boosting circuit 11 can be enhanced by controlling the amplitude of the clock signal according to the number of stages in the boosting circuit, by way of using, for example, the amplitude adjustment circuit 7b shown in FIG. 28.

As described above, according to the semiconductor storage device in the present embodiment, it is possible to suppress the increase of current dissipation and peak current while decreasing the circuit area.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A boosting circuit boosting a power supply voltage and outputting a resultant boosted voltage from an output terminal comprises:
   a first clock terminal supplied with a first clock signal;
   a second clock terminal supplied with a second clock signal, the second clock signal having a phase inverted with respect to a phase of the first clock signal and having same amplitude and period as those of the first clock signal;
   a third clock terminal supplied with a third clock signal;
   a fourth clock terminal supplied with a fourth clock signal, the fourth clock signal having a phase inverted with respect to a phase of the third clock signal and having same amplitude and period as those of the third clock signal;
   a first rectification element connected at a first end thereof to a first power supply terminal, the power supply voltage being applied to the first power supply terminal;
   a first MOS transistor which is connected at a first end thereof to a second end of the first rectification element and is diode-connected;
   a first capacitor connected between a gate of the first MOS transistor and the first clock terminal;
   a second rectification element connected at a first end thereof to a second power supply terminal, the power supply voltage being applied to the second power supply terminal;
   a second MOS transistor which is connected at a first end thereof to a second end of the second rectification element and is diode-connected;
   a second capacitor connected between a gate of the second MOS transistor and the second clock terminal;
   a third rectification element connected at a first end thereof to a second end of the first MOS transistor;
   a third MOS transistor which is connected at a first end thereof to a second end of the third rectification element and is diode-connected;
   a third capacitor connected between a gate of the third MOS transistor and the third clock terminal;
   a forth rectification element connected at a first end thereof to a second end of the second MOS transistor;
   a fourth MOS transistor which is connected at a first end thereof to a second end of the fourth rectification element and is diode-connected;
   a fourth capacitor connected between a gate of the fourth MOS transistor and the fourth clock terminal; and
   a switch circuit which has a low level terminal connected to a first connection node between the first end of the third rectification element and the first end of the fourth rectification element, and a high level terminal connected to a second connection node between a second end of the third MOS transistor and a second end of the fourth MOS transistor, the switch circuit conducting changeover between a voltage at the low level terminal and a voltage at the high level terminal to output a resultant voltage to the output terminal.

2. The boosting circuit according to claim 1, further comprising:
   a first driver connected between the first clock terminal and the first capacitor to amplify amplitude of the first clock signal;
   a second driver connected between the second clock terminal and the second capacitor to amplify amplitude of the second clock signal;
   a third driver connected between the third clock terminal and the third capacitor to amplify amplitude of the third clock signal; and
   a fourth driver connected between the fourth clock terminal and the fourth capacitor to amplify amplitude of the fourth clock signal.

3. The boosting circuit according to claim 1, wherein the third clock signal and the fourth clock signal have larger amplitude than amplitudes of the first clock signal and the second clock signal.

4. The boosting circuit device according to claim 2, wherein the third clock signal and the fourth clock signal have larger amplitude than amplitudes of the first clock signal and the second clock signal.

5. The boosting circuit according to claim 1, wherein,
   when outputting a first voltage, the first to fourth clock signals are input to the first to fourth clock terminals, and the switch circuit outputs a voltage at the high level terminal to the output terminal, and
   when outputting a second voltage lower than the first voltage, the first and second clock signals are input to the first and second clock terminals, fixed voltages instead of the third and fourth clock signals are input to the third and fourth clock terminals, and the switch circuit outputs a voltage at the low level terminal to the output terminal.

6. The boosting circuit according to claim 2, wherein,
   when outputting a first voltage, the first to fourth clock signals are input to the first to fourth clock terminals, and the switch circuit outputs a voltage at the high level terminal to the output terminal, and
   when outputting a second voltage lower than the first voltage, the first and second clock signals are input to the first and second clock terminals, fixed voltages instead of the third and fourth clock signals are input to the third and fourth clock terminals, and the switch circuit outputs a voltage at the low level terminal to the output terminal.

7. The boosting circuit according to claim 3, wherein,
when outputting a first voltage, the first to fourth clock signals are input to the first to fourth clock terminals, and the switch circuit outputs a voltage at the high level terminal to the output terminal, and
when outputting a second voltage lower than the first voltage, the first and second clock signals are input to the first and second clock terminals, fixed voltages instead of the third and fourth clock signals are input to the third and fourth clock terminals, and the switch circuit outputs a voltage at the low level terminal to the output terminal.

8. The boosting circuit according to claim 4, wherein,
when outputting a first voltage, the first to fourth clock signals are input to the first to fourth clock terminals, and the switch circuit outputs a voltage at the high level terminal to the output terminal, and
when outputting a second voltage lower than the first voltage, the first and second clock signals are input to the first and second clock terminals, fixed voltages instead of the third and fourth clock signals are input to the third and fourth clock terminals, and the switch circuit outputs a voltage at the low level terminal to the output terminal.

9. The boosting circuit according to claim 1, wherein the first and second clock signals has period being less than period of the third and fourth clock signals.

10. The boosting circuit according to claim 1, wherein the first to fourth rectification elements are formed of diode-connected MOS transistors.

11. A semiconductor storage device comprising:
a memory cell array having a plurality of memory cell transistors in which data can be rewritten electrically;
a row decoder which controls voltages on word lines connected to control gates of the memory cell transistors;
a boosting circuit which boosts a power supply voltage, outputs a resultant boosted voltage from an output terminal, and supplies the boosted voltage to the row decoder; and
a control circuit which outputs a clock signal to the boosting circuit and controls the boosting circuit,
wherein the boosting circuit comprises:
a first clock terminal supplied with a first clock signal;
a second clock terminal supplied with a second clock signal, the second clock signal having a phase inverted with respect to a phase of the first clock signal and having same amplitude and period as those of the first clock signal;
a third clock terminal supplied with a third clock signal;
a fourth clock terminal supplied with a fourth clock signal, the fourth clock signal having a phase inverted with respect to a phase of the third clock signal and having same amplitude and period as those of the third clock signal;
a first rectification element connected at a first end thereof to a first power supply terminal, the power supply voltage being applied to the first power supply terminal;
a first MOS transistor which is connected at a first end thereof to a second end of the first rectification element and is diode-connected;
a first capacitor connected between a gate of the first MOS transistor and the first clock terminal;
a second rectification element connected at a first end thereof to a second power supply terminal, the power supply voltage being applied to the second power supply terminal;
a second MOS transistor which is connected at a first end thereof to a second end of the second rectification element and is diode-connected;
a second capacitor connected between a gate of the second MOS transistor and the second clock terminal;
a third rectification element connected at a first end thereof to a second end of the first MOS transistor;
a third MOS transistor which is connected at a first end thereof to a second end of the third rectification element and is diode-connected;
a third capacitor connected between a gate of the third MOS transistor and the third clock terminal;
a forth rectification element connected at a first end thereof to a second end of the second MOS transistor;
a fourth MOS transistor which is connected at a first end thereof to a second end of the fourth rectification element and is diode-connected;
a fourth capacitor connected between a gate of the fourth MOS transistor and the fourth clock terminal; and
a switch circuit which has a low level terminal connected to a first connection node between the first end of the third rectification element and the first end of the fourth rectification element, and a high level terminal connected to a second connection node between a second end of the third MOS transistor and a second end of the fourth MOS transistor, the switch circuit conducting changeover between a voltage at the low level terminal and a voltage at the high level terminal to output a resultant voltage to the output terminal.

12. The semiconductor storage device according to claim 11, further comprising:
a first driver connected between the first clock terminal and the first capacitor to amplify amplitude of the first clock signal;
a second driver connected between the second clock terminal and the second capacitor to amplify amplitude of the second clock signal;
a third driver connected between the third clock terminal and the third capacitor to amplify amplitude of the third clock signal; and
a fourth driver connected between the fourth clock terminal and the fourth capacitor to amplify amplitude of the fourth clock signal.

13. The semiconductor storage device according to claim 11, wherein the third clock signal and the fourth clock signal have larger amplitude than amplitudes of the first clock signal and the second clock signal.

14. The semiconductor storage device according to claim 12, wherein the third clock signal and the fourth clock signal have larger amplitude than amplitudes of the first clock signal and the second clock signal.

15. The semiconductor storage device according to claim 11, wherein,
when outputting a first voltage, the first to fourth clock signals are input to the first to fourth clock terminals, and the switch circuit outputs a voltage at the high level terminal to the output terminal, and
when outputting a second voltage lower than the first voltage, the first and second clock signals are input to the first and second clock terminals, fixed voltages instead of the third and fourth clock signals are input to the third and fourth clock terminals, and the switch circuit outputs a voltage at the low level terminal to the output terminal.

16. The semiconductor storage device according to claim 12, wherein,
when outputting a first voltage, the first to fourth clock signals are input to the first to fourth clock terminals, and the switch circuit outputs a voltage at the high level terminal to the output terminal, and when outputting a second voltage lower than the first voltage, the first and second clock signals are input to the first and second clock terminals, fixed voltages instead of the third and fourth clock signals are input to the third and fourth clock terminals, and the switch circuit outputs a voltage at the low level terminal to the output terminal.

17. The semiconductor storage device according to claim 13, wherein, when outputting a first voltage, the first to fourth clock signals are input to the first to fourth clock terminals, and the switch circuit outputs a voltage at the high level terminal to the output terminal, and when outputting a second voltage lower than the first voltage, the first and second clock signals are input to the first and second clock terminals, fixed voltages instead of the third and fourth clock signals are input to the third and fourth clock terminals, and the switch circuit outputs a voltage at the low level terminal to the output terminal.

18. The semiconductor storage device according to claim 14, wherein, when outputting a first voltage, the first to fourth clock signals are input to the first to fourth clock terminals, and the switch circuit outputs a voltage at the high level terminal to the output terminal, and when outputting a second voltage lower than the first voltage, the first and second clock signals are input to the first and second clock terminals, fixed voltages instead of the third and fourth clock signals are input to the third and fourth clock terminals, and the switch circuit outputs a voltage at the low level terminal to the output terminal.

19. The semiconductor storage device according to claim 11, wherein the first and second clock signals has period being less than period of the third and fourth clock signals.

20. The semiconductor storage device according to claim 11, wherein the first to fourth rectification elements are formed of diode-connected MOS transistors.

* * * * *